US007666319B1

(12) United States Patent
Huang

(10) Patent No.: US 7,666,319 B1
(45) Date of Patent: Feb. 23, 2010

(54) SEMICONDUCTOR ETCHING PROCESS TO RELEASE SINGLE CRYSTAL SILICON MIRRORS

(75) Inventor: Kegang Huang, Fremont, CA (US)

(73) Assignee: Miradia Inc., Santa Clara, CA (US)

( * ) Notice: Subject to any disclaimer, the term of this patent is extended or adjusted under 35 U.S.C. 154(b) by 207 days.

(21) Appl. No.: 11/264,898

(22) Filed: Nov. 1, 2005

(51) Int. Cl.
C23F 1/00 (2006.01)

(52) U.S. Cl. .............................. 216/2; 216/24; 216/67; 216/79

(58) Field of Classification Search ........................ None
See application file for complete search history.

(56) References Cited

U.S. PATENT DOCUMENTS

| 4,710,732 | A | * | 12/1987 | Hornbeck | 359/291 |
|---|---|---|---|---|---|
| 4,956,619 | A | * | 9/1990 | Hornbeck | 359/317 |
| 5,028,939 | A | * | 7/1991 | Hornbeck et al. | 347/131 |
| 5,629,790 | A | * | 5/1997 | Neukermans et al. | 359/198 |
| 5,658,698 | A | * | 8/1997 | Yagi et al. | 430/11 |
| 6,020,215 | A | * | 2/2000 | Yagi et al. | 438/52 |
| 6,020,270 | A | * | 2/2000 | Wong et al. | 438/719 |
| 6,044,705 | A | * | 4/2000 | Neukermans et al. | 73/504.02 |
| 6,194,037 | B1 | * | 2/2001 | Terasaki et al. | 427/569 |
| 6,201,631 | B1 | * | 3/2001 | Greywall | 359/245 |
| 6,218,309 | B1 | * | 4/2001 | Miller et al. | 438/700 |
| 6,467,345 | B1 | * | 10/2002 | Neukermans et al. | 73/504.02 |
| 6,849,471 | B2 | * | 2/2005 | Patel et al. | 438/21 |
| 6,913,942 | B2 | * | 7/2005 | Patel et al. | 438/48 |
| 7,006,275 | B2 | * | 2/2006 | Huibers | 359/290 |
| 7,012,731 | B2 | * | 3/2006 | Huibers | 359/290 |
| 7,018,052 | B2 | * | 3/2006 | Huibers | 353/99 |
| 7,023,606 | B2 | * | 4/2006 | Huibers | 359/290 |
| 7,092,143 | B2 | * | 8/2006 | Heureux | 359/291 |
| 7,138,693 | B2 | * | 11/2006 | Patel et al. | 257/414 |
| 7,167,297 | B2 | * | 1/2007 | Huibers | 359/290 |
| 7,172,296 | B2 | * | 2/2007 | Huibers | 353/99 |
| 7,196,740 | B2 | * | 3/2007 | Huibers | 348/744 |
| 7,202,989 | B2 | * | 4/2007 | Yang | 359/291 |
| 7,245,416 | B2 | * | 7/2007 | Pan et al. | 359/291 |
| 7,262,817 | B2 | * | 8/2007 | Huibers | 348/771 |
| 7,265,892 | B2 | * | 9/2007 | Huibers | 359/291 |
| 7,300,162 | B2 | * | 11/2007 | Huibers | 353/99 |
| 7,374,962 | B2 | * | 5/2008 | Huang et al. | 438/67 |
| 7,382,519 | B2 | * | 6/2008 | Yang | 359/291 |
| 2002/0084478 | A1 | * | 7/2002 | Keller et al. | 257/296 |
| 2003/0232200 | A1 | * | 12/2003 | Bryan et al. | 428/446 |
| 2003/0234994 | A1 | * | 12/2003 | Pan | 359/871 |

(Continued)

Primary Examiner—Allan Olsen
(74) Attorney, Agent, or Firm—Townsend and Townsend and Crew LLP

(57) ABSTRACT

A spatial light modulator structure is fabricated by forming moveable reflecting elements through plasma etching of silicon in a chlorine ambient. In accordance with one particular embodiment, a mirror comprising single crystal silicon is released from the surrounding material by plasma etching in an ambient including chlorine ($Cl_2$), sulfur hexafluoride ($SF_6$), and boron trichloride ($BCl_3$). $Cl_2$ serves as a source of reactive chlorine etching species for the plasma. $SF_6$ provides a source of fluorine, a reactive species enhancing the rate of etching single crystal silicon. $BCl_3$ provides boron, which becomes incorporated on the surface of the etched single crystal silicon as a passivation layer controlling etch profile. Plasma etching of the single crystal silicon to release the mirrors takes place in the absence of oxygen, in order to avoid unwanted formation of silicon oxide residue that can adversely affect mechanical and optical properties of the resulting device.

17 Claims, 19 Drawing Sheets

U.S. PATENT DOCUMENTS

| | | | |
|---|---|---|---|
| 2004/0004753 A1* | 1/2004 | Pan | 359/263 |
| 2004/0069742 A1* | 4/2004 | Pan | 216/24 |
| 2004/0145795 A1* | 7/2004 | Pan et al. | 359/291 |
| 2004/0145822 A1* | 7/2004 | Pan et al. | 359/872 |
| 2004/0159631 A1* | 8/2004 | Pan et al. | 216/24 |
| 2004/0191937 A1* | 9/2004 | Patel et al. | 438/21 |
| 2004/0191946 A1* | 9/2004 | Patel et al. | 438/57 |
| 2004/0214350 A1* | 10/2004 | Pan et al. | 438/1 |
| 2005/0054135 A1* | 3/2005 | Patel et al. | 438/52 |
| 2005/0157375 A1* | 7/2005 | Doan et al. | 359/291 |
| 2005/0157376 A1* | 7/2005 | Huibers et al. | 359/291 |
| 2005/0250362 A1* | 11/2005 | Doan et al. | 439/264 |
| 2006/0077525 A1* | 4/2006 | Huibers | 359/291 |
| 2006/0082858 A1* | 4/2006 | Heureux | 359/291 |
| 2006/0209387 A1* | 9/2006 | Pan et al. | 359/291 |
| 2006/0274397 A1* | 12/2006 | Yang | 359/245 |
| 2006/0274399 A1* | 12/2006 | Yang | 359/291 |
| 2006/0285192 A1* | 12/2006 | Yang | 359/291 |
| 2007/0015304 A1* | 1/2007 | Doan | 438/52 |
| 2007/0018261 A1* | 1/2007 | Doan | 257/414 |
| 2007/0159707 A1* | 7/2007 | Yang | 359/872 |
| 2007/0287214 A1* | 12/2007 | Huang et al. | 438/50 |
| 2008/0131689 A1* | 6/2008 | Billieres et al. | 428/332 |

* cited by examiner

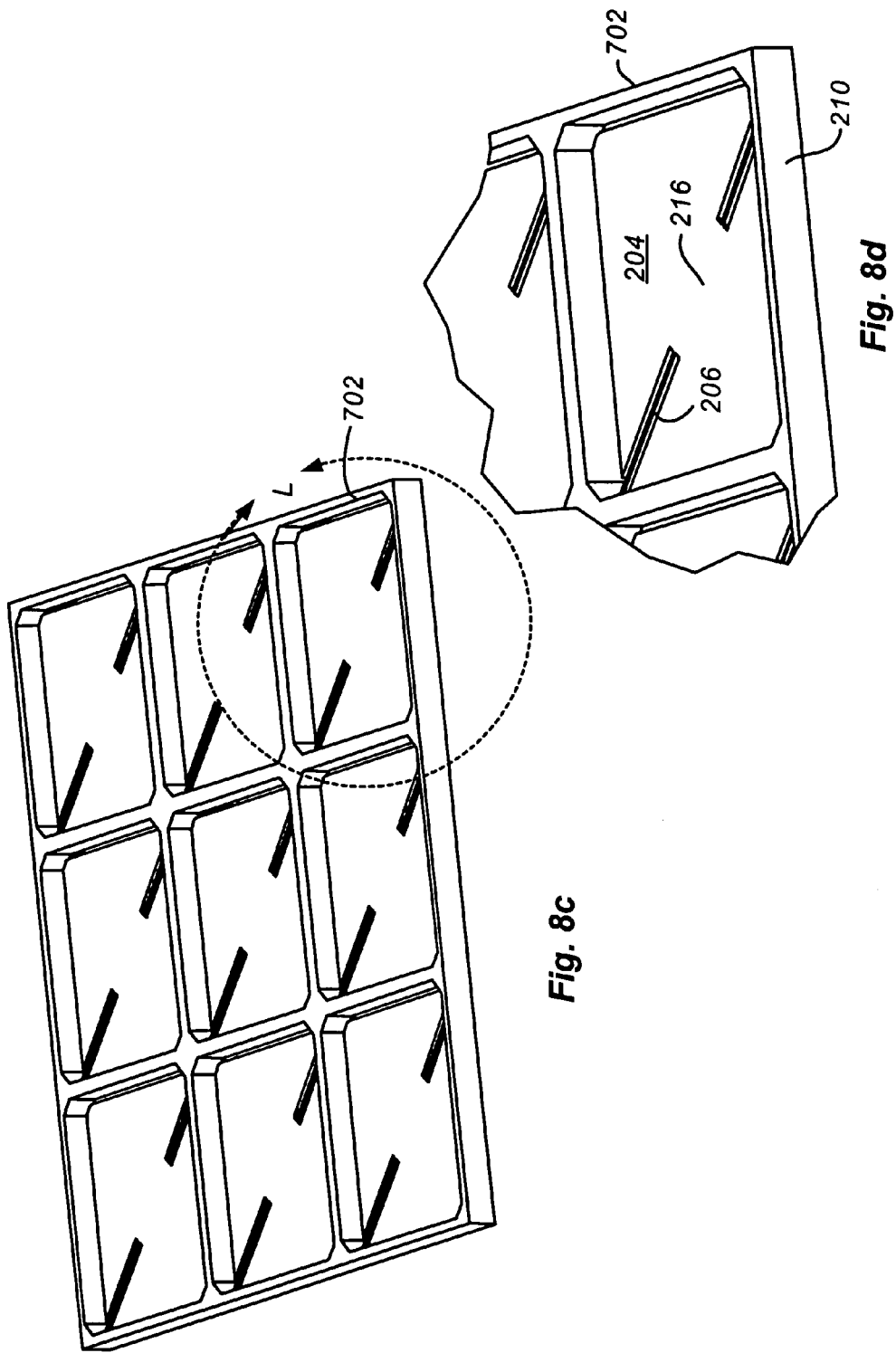

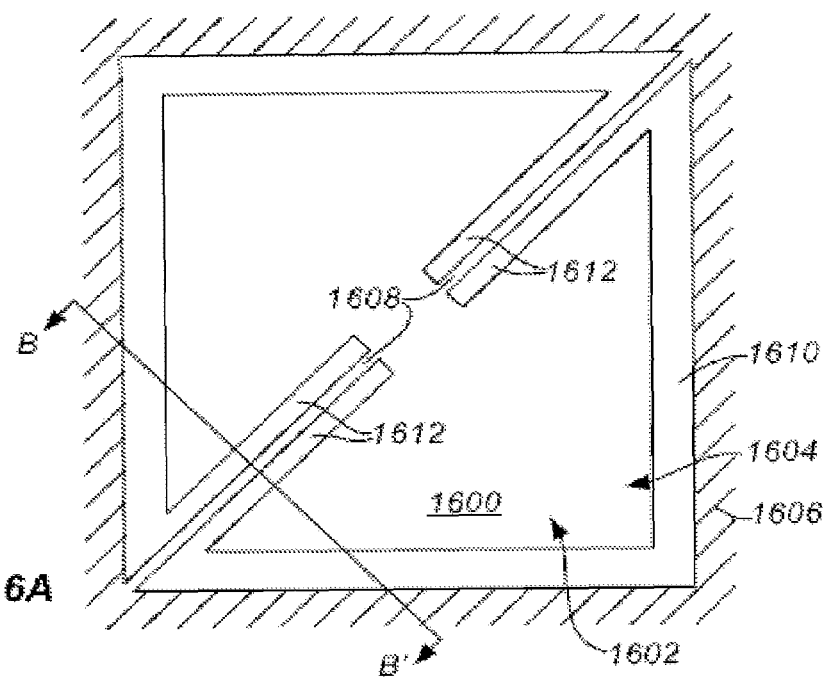
*Fig. 16A*
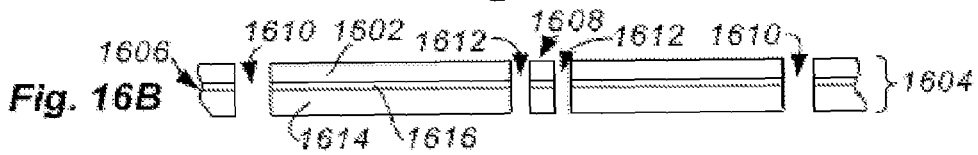
*Fig. 16B*
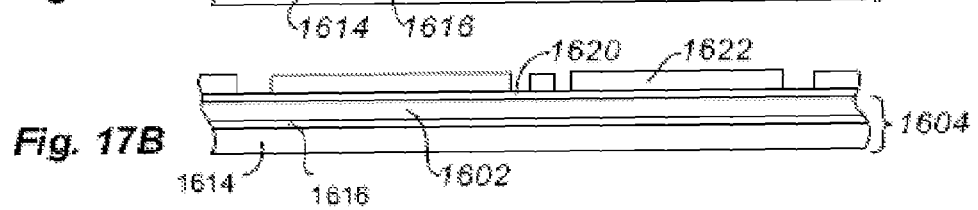
*Fig. 17A*
*Fig. 17B*
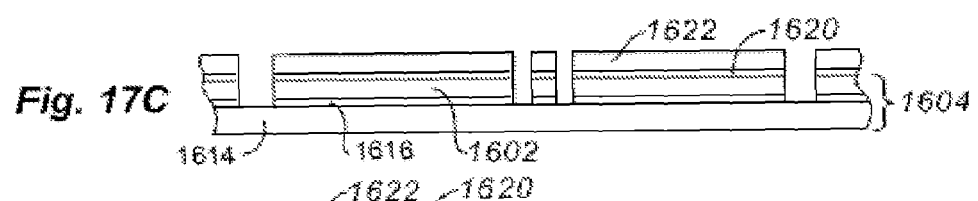
*Fig. 17C*
*Fig. 17D*

SEMICONDUCTOR ETCHING PROCESS TO RELEASE SINGLE CRYSTAL SILICON MIRRORS

BACKGROUND OF THE INVENTION

Spatial light modulators (SLMS) have numerous applications in the areas of optical information processing, projection displays, video and graphics monitors, televisions, and electrophotographic printing. Reflective SLMs are devices that modulate incident light in a spatial pattern to reflect an image corresponding to an electrical or optical input. The incident light may be modulated in phase, intensity, polarization, or deflection direction. A reflective SLM is typically comprised of an area or two-dimensional array of addressable picture elements (pixels) capable of reflecting incident lights. Source pixel data is first processed by an associated control circuit, then loaded into the pixel array, one frame at a time.

SLM devices are typically fabricated by defining moveable reflective elements. These moveable reflective elements are typically fabricated by etching along a periphery, in order to release them from the surrounding material.

Where the moveable reflective elements are formed from single crystal silicon, a plasma etching step in an ambient including oxygen, has conventionally been employed for this mirror releasing process. Use, however, of such oxygen-containing plasmas to release the moveable reflecting elements, offers certain disadvantages. For example, etching in an oxygen ambient may create residues that can undesirably affect the mechanical and optical properties of the resulting device. In addition, etching in an oxygen plasma may undesirably result in physical damage to the thin mirror structures due to plasma charging.

Accordingly, there is a need in the art for improved methods of fabricating SLM devices.

BRIEF SUMMARY OF THE INVENTION

A spatial light modulator structure is fabricated by forming moveable reflecting elements through plasma etching of silicon in a chlorine ambient. In accordance with one particular embodiment, a mirror comprising single crystal silicon is released from the surrounding material by plasma etching in an ambient including chlorine ($Cl_2$), sulfur hexafluoride ($SF_6$), and boron trichloride ($BCl_3$). $Cl_2$ serves as a source of reactive chlorine etching species for the plasma. $SF_6$ provides a source of fluorine, a reactive species enhancing the rate of etching single crystal silicon. $BCl_3$ provides boron, which becomes incorporated on the surface of the etched single crystal silicon as a passivation layer controlling etch profile. Plasma etching of the single crystal silicon to release the mirrors takes place in the absence of oxygen, in order to avoid unwanted formation of silicon oxide residue that can adversely affect mechanical and optical properties of the resulting device.

An embodiment of a method in accordance with the present invention for fabricating a spatial light modulator, comprises, providing in a processing chamber, a substrate comprising single crystal silicon having a mask patterned thereon to define inter-mirror regions and hinge regions. A chlorine-containing gas is flowed into the processing chamber in an absence of oxygen. Power is applied to the processing chamber to generate a plasma from the chlorine-containing gas, and the inter-mirror regions are exposed to the plasma to remove the single crystal silicon in the inter-mirror regions, thereby releasing a micro-mirror from the surrounding single crystal silicon.

An embodiment of a method in accordance with the present invention for defining a moveable reflecting element of a spatial light modulator, comprises, providing a substrate comprising single crystal silicon, patterning a mask on the substrate to define inter-mirror regions, and etching through the substrate in inter-mirror regions with a plasma generated in an ambient substantially lacking oxygen.

These and other objects and features of the present invention and the manner of obtaining them will become apparent to those skilled in the art, and the invention itself will be best understood by reference to the following detailed description read in conjunction with the accompanying drawings.

BRIEF DESCRIPTION OF THE DRAWINGS

FIGS. 8a-8d are perspective views showing the top and bottom of the alternate micro mirror array.

FIGS. 16A-B show simplified plan and cross-sectional views, respectively, of an embodiment of a pixel of a micromirror array in accordance with the present invention.

FIGS. 17A-D show simplified cross-sectional views of the steps for fabricating the micromirror array of FIGS. 16A-B in accordance with an embodiment of the present invention.

DETAILED DESCRIPTION OF THE INVENTION

Spatial Light Modulator Overview

Figure 1:
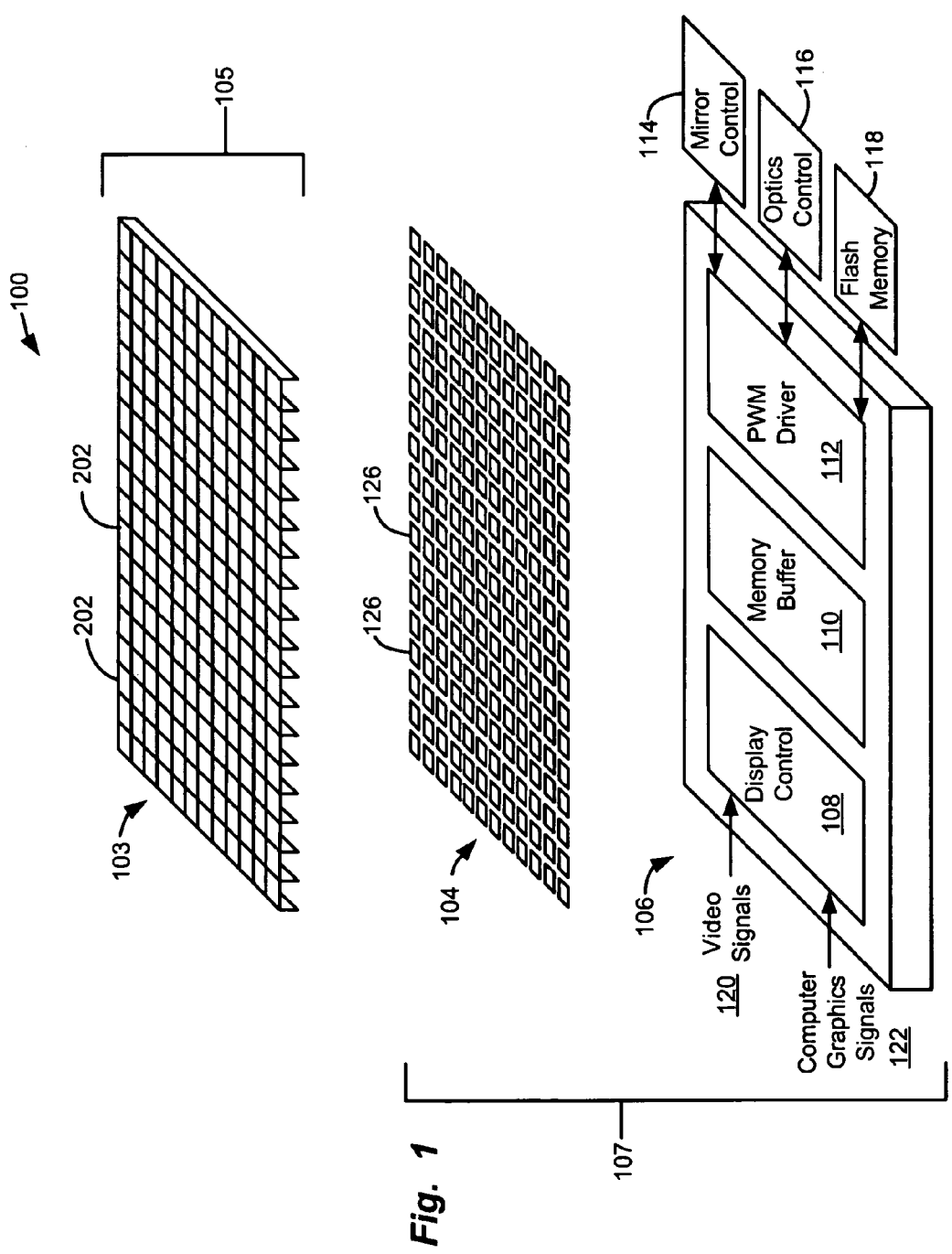
FIG. 1 is a diagram that illustrates the general architecture of a spatial light modulator according to one embodiment of the invention.

FIG. 1 is a diagram that illustrates the general architecture of an SLM 100 according to one embodiment of the invention.

The reflective spatial light modulator ("SLM") 100 has an array 103 of deflectable mirrors 202. Individual mirrors 202 can be selectively deflected by applying a voltage bias between that mirror and a corresponding electrode 126. The deflection of each mirror 202 controls light reflected from a light source to a video display. Thus, controlling the deflection of a mirror 202 allows light striking that mirror 202 to be reflected in a selected direction, and thereby allows control of the appearance of a pixel in the video display.

The illustrated embodiment has three layers. The first layer is a mirror array 103 that has a plurality of deflectable micro mirrors 202. In one preferred embodiment; the micro-mirror array 103 is fabricated from a first substrate 105 that is a single material, such as single crystal silicon.

The second layer is an electrode array 104 with a plurality of electrodes 126 for controlling the micro-mirrors 202. Each electrode 126 is associated with a micro-mirror 202 and controls the deflection of that micro-mirror 202. Addressing circuitry allows selection of a single electrode 126 for control of the particular micro-mirror 202 associated with that electrode 126.

The third layer is a layer of control circuitry 106. This control circuitry 106 has addressing circuitry, which allows the control circuitry 106 to control a voltage applied to selected electrodes 126. This allows the control circuitry 106 to control the deflections of the mirrors 202 in the mirror array 103 via the electrodes 126. Typically, the control circuitry 106 also includes a display control 108, line memory buffers 110, a pulse width modulation array 112, and inputs for video signals 120 and graphics signals 122. A microcontroller 114, optics control circuitry 116, and a flash memory 118 may be external components connected to the control circuitry 106, or may be included in the control circuitry 106 in some embodiments. In various embodiments, some of the above listed parts of the control circuitry 106 may be absent, may be on a separate substrate and connected to the control circuitry 106, or other additional components may be present as part of the control circuitry 106 or connected to the control circuitry 106.

In one embodiment, both the second layer 104 and the third layer 106 fabricated using semiconductor fabrication technology on a single second substrate 107. That is, the second layer 104 is not necessarily separate and above the third layer 106. Rather the term "layer" is an aid for conceptualizing different parts of the spatial light modulator 100. For example, in one embodiment, both the second layer 104 of electrodes is fabricated on top of the third layer of control circuitry 106, both fabricated on a single second substrate 107. That is, the electrodes 126, as well as the display control 108, line memory buffers 110, and the pulse width modulation array 112 are all fabricated on a single substrate in one embodiment. Integration of several functional components of the control circuitry 106 on the same substrate provides an advantage of improved data transfer rate over conventional spatial light modulators, which have the display control 108, line memory buffers 110, and the pulse width modulation array 112 fabricated on a separate substrate. Further, fabricating the second layer of the electrode array 104 and the third layer of the control circuitry 106 on a single substrate 107 provides the advantage of simple and cheap fabrication, and a compact final product.

After the layers 103, 104, and 106 are fabricated, they are bonded together to form the SLM 100. The first layer with the mirror array 103 covers the second and third layers 104, 106. The area under the mirrors 202 in the mirror array 103 determines how much room there is beneath the first layer 103 for the electrodes 126, and addressing and control circuitry 106. There is limited room beneath the micro mirrors 202 in the mirror array 103 to fit the electrodes 126 and the electronic components that form the display control 108, line memory buffers 110, and the pulse width modulation array 112. The present invention uses fabrication techniques (described more fully below) that allow the creation of small feature sizes, such as processes that allow fabrication of features of 0.18 microns, and processes that allow the fabrication of features of 0.13 microns or smaller. Conventional spatial light modulators are made through fabrication processes that do not allow such small features. Typically, conventional spatial light modulators are made through. fabrication processes that limit feature size to approximately 1 micron or larger. Thus, the present invention allows the fabrication of many more circuit devices, such as transistors, in the limited area beneath the micro mirrors of the mirror array 103. This allows integration of items such as the display control 108, line memory buffers 110, and the pulse width modulation array 112 on the same substrate as the electrodes 126. Including such control circuitry 106 on the same substrate 107 as the electrodes 126 improves the performance of the SLM 100.

In other embodiments, various combinations of the electrodes 126 and components of the control circuitry may be fabricated on different substrates—and electrically connected.

Figure 2A:
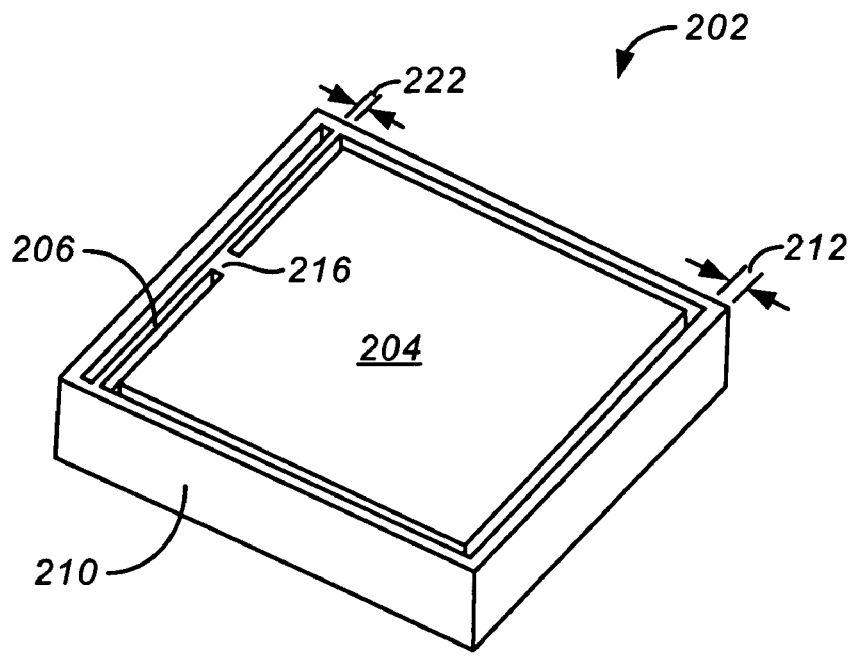
FIGS. 2a and 2b are perspective views of a single micro mirror.

The Mirror:

FIG. 2a is a perspective view of a single micro mirror 202. In one preferred embodiment, the micro mirror 202 is fabricated from a wafer of a single material, such as single crystal silicon. Thus, the first substrate 105 in such an embodiment is a wafer of single crystal silicon. Fabricating the micro mirror 202 out of a single material wafer greatly simplifies the fabrication of the mirror 202. Further, single crystal silicon can be polished to create smooth mirror surfaces that have an order of magnitude smoother surface roughness than those of deposited films. Mirrors 202 fabricated from single crystal silicon are mechanically rigid, which prevents undesired bending or warping of the mirror surface, and hinges fabricated from single crystal silicon are durable, flexible, and reliable. In other embodiments, other materials may be used instead of single crystal silicon. One possibility is the use of another type of silicon (e.g. polysilicon, or amorphous silicon) for the micro mirror 202, or even making the mirror 202 completely out of a metal (e.g. an aluminum alloy, or tungsten alloy).

The micro mirror 202 has a top mirror plate 204. This mirror plate 204 is the portion of the micro mirror 202 that is selectively deflected by applying a voltage bias between the mirror 202 and a corresponding electrode 126. In one embodiment this reflective mirror plate 204 is substantially square in shape, and approximately fifteen microns by fifteen microns, for an approximate area of 225 square microns, although other shapes and sizes are also possible. In one preferred embodiment, a large proportion of the surface area of the micro mirror array 103 is made up of the areas of the mirror plates 204 of the micro mirrors 202.

The mirror plate 204 has a reflective surface that reflects light from a light source at an angle determined by the deflection of the mirror plate 204. This reflective surface may be the same material from which the micro mirror 202 is fabricated, in which case the surface of the mirror plate 204 is polished to a smoothness that provides the desired level of reflectivity. Alternatively, after fabrication of the micro-mirrors 202, a layer of reflective material, such as aluminum may be added to the surface of the mirror plate 204. Since in a preferred embodiment a large proportion of the surface area of the micro mirror array 103 is made up of the areas of the mirror plates 204 of the micro mirrors, and the mirror plates 204 have reflective surfaces, a large proportion of the surface area of the micro mirror array 103 is reflective and capable of reflecting light at a selected angle. Thus, the SLM 100 has a large fill ratio, and efficiently reflects incident light.

The mirror plate 204 is connected to a torsion spring hinge 206 by a connector 216. The torsion spring hinge 206 is connected to a spacer support frame 210, which holds the torsion spring 206 in place. Note that other springs and connection schemes between the mirror plate 204, the hinge 206, and spacer support frame 210 could also be used. The torsion spring hinge 206 allows the mirror plate 204 to rotate relative to the spacer support frame 210 about an axis between the walls of the spacer support frame 210 when a force such as an electrostatic force is applied to the mirror plate 204 by applying a voltage between the mirror 202 and the corresponding electrode 126. This rotation produces the angular deflection for reflecting light in a selected direction. In one embodiment, this rotation occurs about an axis that is substantially collinear with the long axis of the hinge. In one preferred embodiment, the torsion spring hinge 206 has a "vertical" alignment. That is, the hinge 206 has a width 222 that is smaller than the depth of the hinge (perpendicular to the mirror plate 204 surface). The width of the hinge is typically between 0.1 microns to 0.5 microns, and is approximately 0.2 microns in one embodiment. This "vertical" alignment of the hinge functions to help minimize non-reflective surfaces on the surface of the mirror array 103, and keep the fill ratio high. Also in one preferred embodiment, the The spacer support frame 210 separates the mirror plate 204 from the electrodes and addressing circuitry so that the mirror plate 204 may deflect downward without contacting the electrodes and other circuitry below. The spacer support frame 210 includes spacer walls in one embodiment, which are typically not separate components from the rest of the spacer support frame 210. These walls help define the height of the spacer support frame 210. The height of the spacers 210 is chosen based on the desired separation between the mirror plates 204 and the electrodes 126, and the topographic design of the electrodes. A larger height allows more deflection of the mirror plate 204, and a higher maximum deflection angle. A larger deflection angle provides a better contrast ratio. In one embodiment, the maximum deflection angle of the mirror plate 204 is 20 degrees. The spacer support frame 210 also provides support for the hinge 206 and spaces the mirror plate 204 from other mirror plates 204 in the mirror array 103. The spacer support frame 210 has a spacer wall width 212, which when added to a gap between the mirror plate 204 and the support frame 210, is substantially equal to the distance between adjacent mirror plates 204 of adjacent micro mirrors 202. In one embodiment, the spacer wall width 212 is 1 micron or less. In one preferred embodiment, the spacer wall width 212 is 0.5 microns or less. This places the mirror plates 204 closely together to increase the fill ratio of the mirror array 103.

In some embodiments, the micro mirror 202 includes elements that stop the deflection of the mirror plate 204 when the plate 204 has deflected downward to a predetermined angle. Typically, these elements include a motion stop and a landing tip. When the mirror surface 204 deflects, the motion stop on the mirror plate 204 contacts the landing tip. When this occurs, the mirror plate 204 can deflect no further. There are several possible configurations for the motion stop and landing tip. In one embodiment, a landing tip is fabricated on the spacer frames 210 opposite to the hinge side. The maximum tilt angle of mirror plate 204 will be limited by the landing tip on the spacer frames 210 which stops the downward mechanical motion of the mirror plate 204. Having a fixed maximum tilt angle simplifies controlling the spatial light modulator 100 to reflect incident light in a known direction.

In another embodiment, landing tips are fabricated along with the electrodes 126 on the second substrate 107. The landing tips of this embodiment may be fabricated from an insulator, such as silicon dioxide, to prevent a short circuit between the mirror plate 204 and the electrode 126. The maximum tilt angle of the mirror plate 204 is limited in this embodiment by the angle at which the mirror plate 204 contacts the landing tip on the second substrate 107. The height of the spacers 210 affects this angle; higher spacers 210 allow larger angles than lower ones. The landing tip on the second substrate 107 can be a protruding bump, which reduces the total surface area actually in contact. The bumps can be held at the same electrical potential as the mirror plate 204 to avoid welding on contact.

In yet another embodiment, the gap between the mirror plate 204 and the hinge 206 is accurately fabricated so when the mirror plate 204 tilts to a predetermined angle, the corners of the plate 204 near the hinge 206 will contact the ends of the hinge 206, which act as mechanical stops. This occurs because the section of the hinge 206 connected to the mirror plate 204 deflects along with the mirror plate 204, but the sections of the hinge 206 near the support wall 210 remain relatively undeflected. For example, with a height of the torsion hinge 206 being 1 micron, a gap of 0.13 microns between the support wall and the hinge 206 will result in a maximum tilting angle of the mirror plate 204 of 15 degrees.

In one preferred embodiment, the motion stop and landing tip are both made out of the same material as the rest of the mirror 202, and are both fabricated out of the first substrate 105. In embodiments where the material is single crystal silicon, the motion stop and landing tip are therefore made out of a hard material that has a long functional lifetime, which allows the mirror may 103 to last a long time. Further, because single crystal silicon is a hard material, the motion stop and landing tip can be fabricated with a small area where the motion stop contacts the landing tip, which greatly reduces sticking forces and allows the mirror plate 204 to deflect freely. Also, this means that the motion stop and landing tip remain at the same electrical potential, which prevents sticking that would occur via welding and charge injection processes were the motion stop and landing tip at different electrical potentials.

Figure 2B:
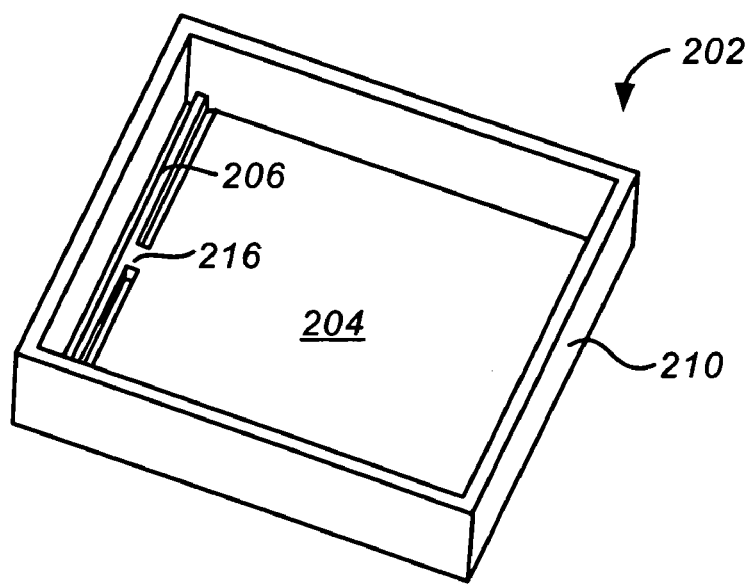

FIG. 2b is a perspective view illustrating the underside of a single micro mirror 202, including the support walls 210, the mirror plate 204, the hinge 206, and the connector 216.

Figure 3A:
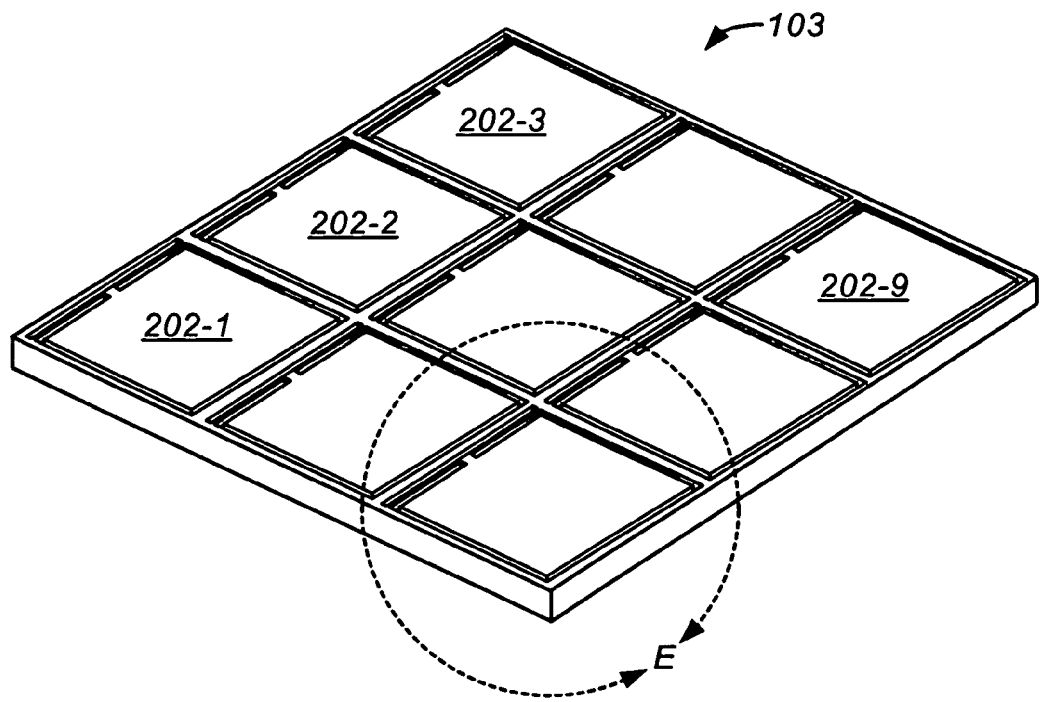
FIGS. 3a and 3b are perspective views showing the top and sides of a micro mirror array.

FIG. 3a is a perspective view showing the top and sides of a micro mirror array 103 having nine micro mirrors 202-1 through 202-9. While FIG. 3a shows the micro mirror array 103 with three rows and three columns, for a total of nine micro mirrors 202, micro mirror arrays 103 of other sizes are also possible. Typically, each micro mirror 202 corresponds to a pixel on a video display. Thus, larger arrays 103 with more micro mirrors 202 provide a video display with more pixels. Since hinges 206 in mirror array 103 all face in parallel along one direction, light sources are directed at mirrors 202 in the array 103 along a single direction to be reflected to form a projected image on the video display.

Figure 3B:
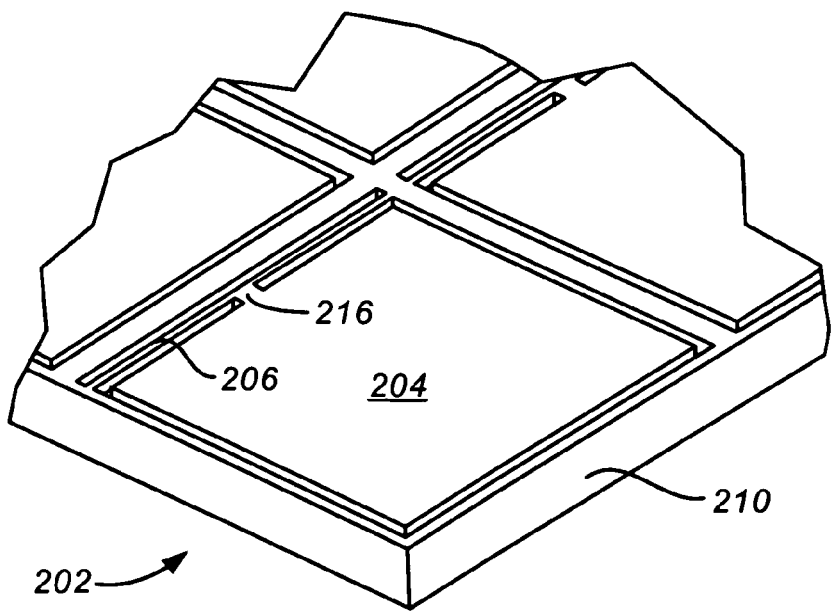

As shown in FIG. 3a, the surface of the micro mirror may 103 has a large fill ratio. That is, most of the surface of the micro mirror array 103 is made up of the reflective surfaces of the mirror plates 204 of the micro mirrors 202. Very little of the surface of the micro mirror array 103 is nonreflective. As illustrated in FIG. 3a, the nonreflective portions of the micro mirror array 103 surface are the areas between the reflective surfaces of the micro mirrors 202. For example, the width of the area between mirror 202-1 and 202-2 is determined by the spacer wall width 212 and the sum of the width of the gaps between the mirror plates 204 of mirrors 202-1 and 202-2 and the support wall 210. The gaps and the spacer wall width 212 can be made as small as the feature size supported by the fabrication technique. Thus, in one embodiment, the gaps are 0.2 micron, and in another embodiment the gaps are 0.13 micron. As semiconductor fabrication techniques allow smaller features, the size of the spacer will 210 and the gaps can decrease to allow higher fill ratios. FIG. 3b is a perspective view detailing one mirror 202 of the mirror array 103 of FIG. 3a. Embodiments of the present invention allow fill ratios of 85%, 90%, or even higher.

Figure 4A:
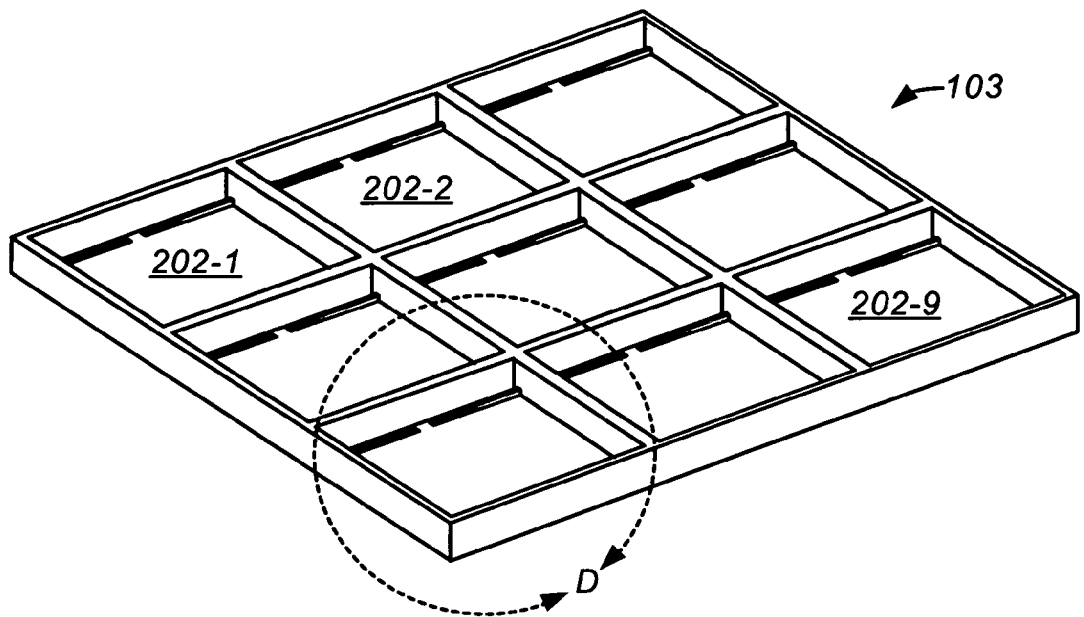
FIGS. 4a and 4b are perspective views showing the bottom and sides of the micro mirror array.
Figure 4B:
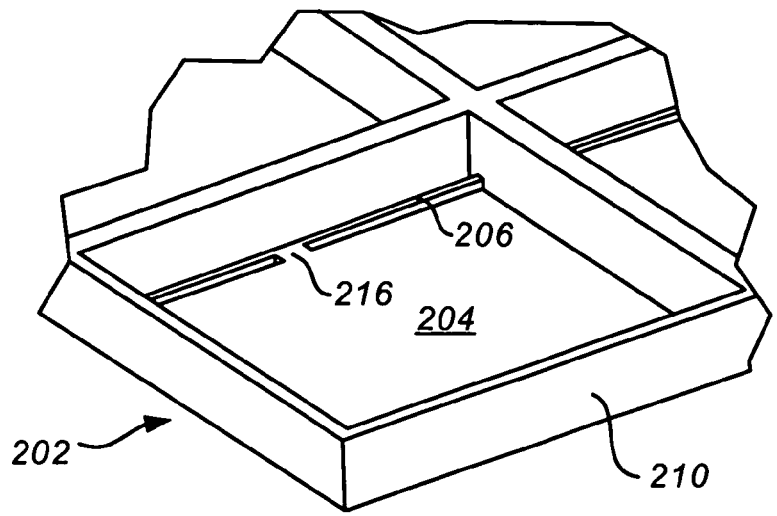

FIG. 4a is a perspective view showing the bottom and sides of the micro mirror array 103 shown in FIG. 3. As shown in FIG. 4a, the spacer support frames 210 of the micro mirrors 202 define cavities beneath the mirror plates 204. These cavities provide room for the mirror plates 204 to deflect downwards, and also allow large areas beneath the mirror plates 204 for placement of the second layer 104 with the electrodes 126, and/or the third layer with the control circuitry 106. FIG. 4b is a perspective view detailing one mirror 202 of the mirror array 103 of FIG. 4a.

Figure 5A:
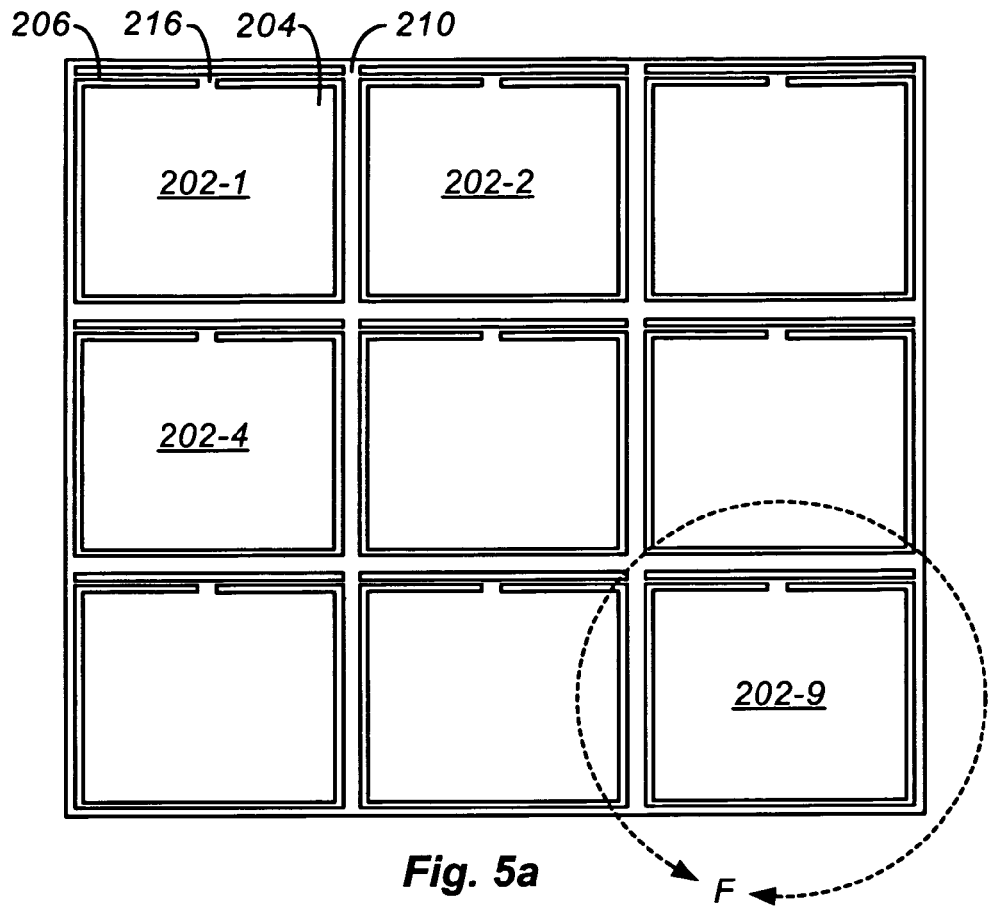
FIGS. 5a and 5b are top views of the micro mirror array.
Figure 5B:
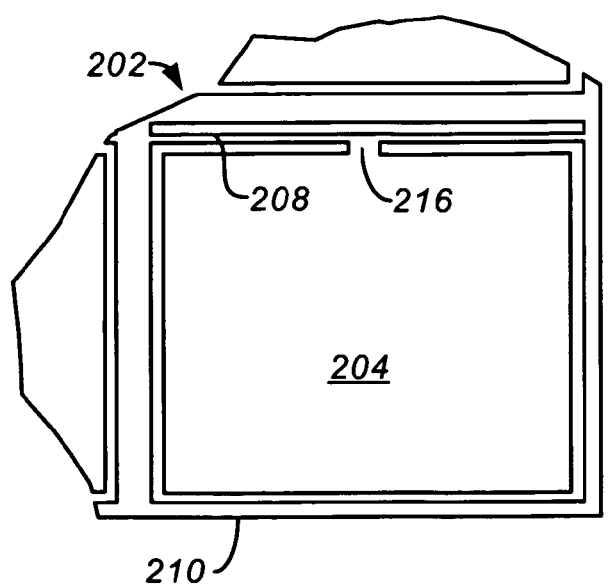

FIG. 5a is a top view of the micro mirror array 103 having nine micro mirrors 202-1 through 202-9 shown in FIGS. 3a and 4a. For example, for micro mirror 202-1, FIG. 5a illustrates the mirror plate 204, the spacer support frame 210, the torsion spring 206, and the connector 216 connecting the mirror plate 204 to the torsion spring 206. FIG. 5a also clearly illustrates, as described above with respect to FIG. 3a, that the micro mirror array 103 has a large fill ratio. Most of the surface of the micro mirror array 103 is made up of the reflective surfaces of the micro mirrors 202-1 through 202-9. FIG. 5a clearly illustrates how fill ratio is determined by the areas of the reflective mirror plates 204 and the areas between the reflective surfaces of the mirror plates 204. The size of the areas between the reflective surfaces of the mirror plates 204 in one embodiment is limited by the feature size limit of the fabrication process. This determines how small the gaps between the mirror plate 204 and the spacer wall 210 can be made, and how thick the spacer wall 210 is. Note that, while the single mirror 202 as shown in FIG. 2 has been described as having its own spacer support frame 210, there are not typically two separate abutting spacer walls 210 between mirrors such as mirrors 202-1 and 202-2. Rather, there is typically one physical spacer wall of the support frame 210 between mirrors 202-1 and 202-2. FIG. 5b is a perspective view detailing one mirror 202 of the mirror array 103 of FIG. 5a.

Figure 6A:
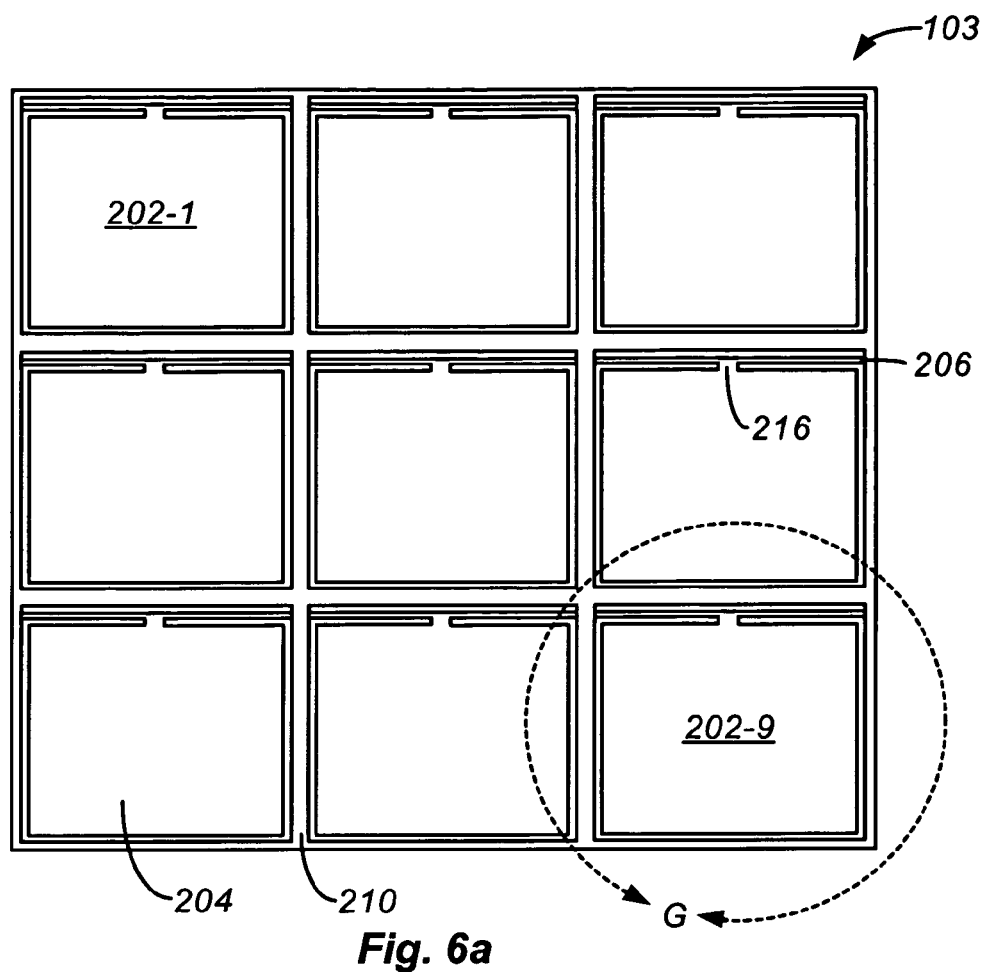
FIGS. 6a and 6b are bottom views of the micro mirror array.
Figure 6B:
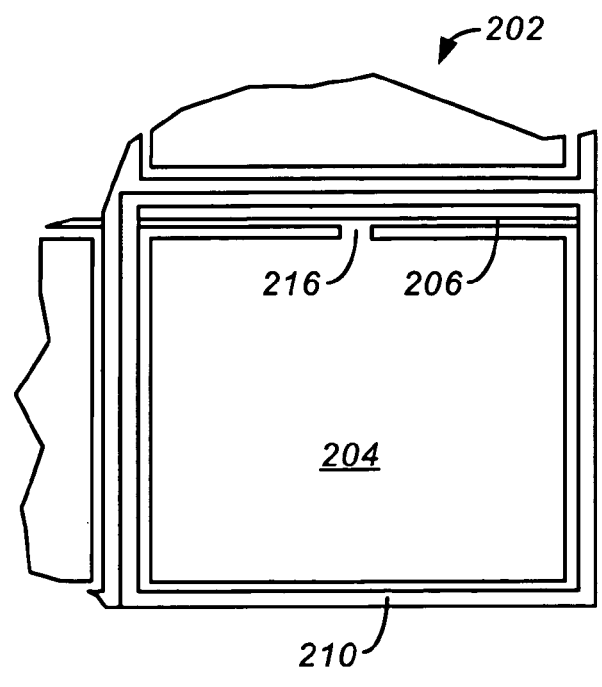

FIG. 6a is a bottom view of the micro mirror array 103 having nine micro mirrors 202-1 through 202-9, as shown in FIGS. 3 through 5. FIG. 6a shows the bottom of the mirror plates 204, as well as the bottoms of the spacer support frames 210, the torsion springs 206, and the connectors 216. The area beneath the mirror plates 204 is large enough in many embodiments to allow the optimum design and placement of electrodes 126 and control circuitry 106, and space for accommodating a possible mirror landing tip. FIG. 6b is a perspective view detailing one mirror 202 of the mirror array 103 of FIG. 6a As seen in FIGS. 5a and 6a, very little light that is normal to the mirror plate 204 can pass beyond the micro mirror array 103 to reach any the electrodes 126 or control circuitry 106 beneath the micro mirror array 103. This is because the spacer support frame 210, the torsion spring 206, the connector 216, and the mirror plate 204 provide near complete coverage for the circuitry beneath the micro mirror array 103. Also, since the spacer support frame 210 separates the mirror plate 204 from the circuitry beneath the micro mirror array 103, light traveling at a non perpendicular angle to the mirror plate 204 and passing beyond the mirror plate 204 is likely to strike a wall of the spacer support frame 210 and not reach the circuitry beneath the micro mirror may 103. Since little intense light incident on the mirror may 103 reaches the circuitry, the SLM 100 avoids problems associated with intense light striking the circuitry. These problems include the incident light heating up the circuitry, and the incident light photons charging circuitry elements, both of which can cause the circuitry to malfunction.

In FIGS. 3-6 each micro mirror 202 in the micro mirror array 103 has its torsion spring 206 on the same side. In one alternate embodiment, different micro mirrors 202 in the micro mirror array 103 have torsion springs 206 on different sides. For example, returning to FIG. 3a, mirrors 202-1 and 202-3 would have springs 206 on the same side as illustrated. Mirror 202-2, in contrast, would have a spring 206 on different side so that the spring 206 of mirror 202-2 is perpendicular to the springs 206 of mirrors 202-1 and 202-3. This allows the mirror plates 204 of the different micro mirrors 202-1 and 202-2 to deflect in different directions, which gives the mirror array 103 as a whole more than one controllable degree of freedom. In this alternate embodiment, two different light sources (for example, light sources with differently colored light) can be directed toward the micro mirror array 103 and separately selectively redirected by the micro mirrors 202 in the micro mirror may 103 form an image on a video display. In such an embodiment; multiple micro mirrors 202 can be used to reflect light from the multiple light sources to the same pixel in the video display. For example, two different color light sources can be directed toward the mirror array 103 along different directions, and reflected by the array 103 to form a multicolor image on a video display. The micro mirrors 202-1 and 202-3 with torsion springs 206 on a first side control the reflection of a first light source to the video display. The micro mirrors such as micro mirror 202-2 with torsion springs 206 on a different second side control the reflection of a second light source to the video display.

Figure 7A:
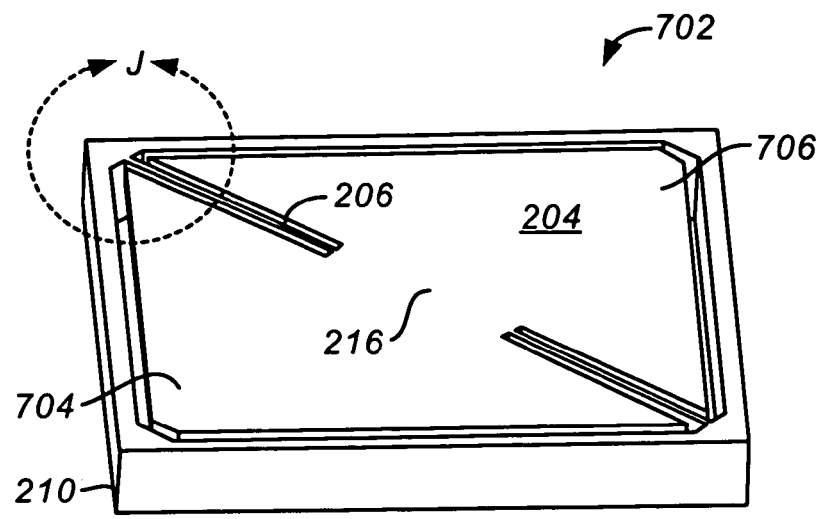
FIGS. 7a-7d are perspective views showing the top, bottom, and sides of a single mirror of an alternate embodiment of the micro mirror array.
Figure 7B:
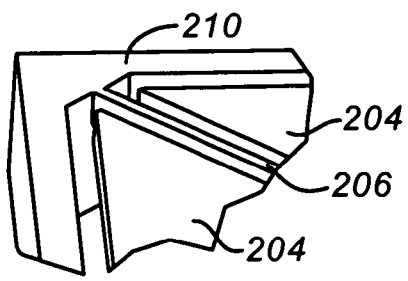
Figure 7D:
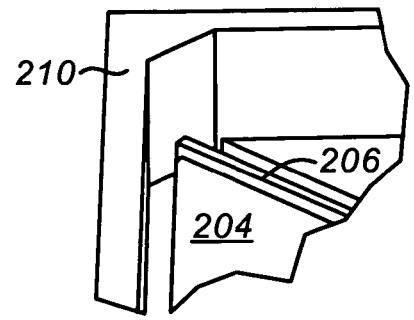
Figure 7C:
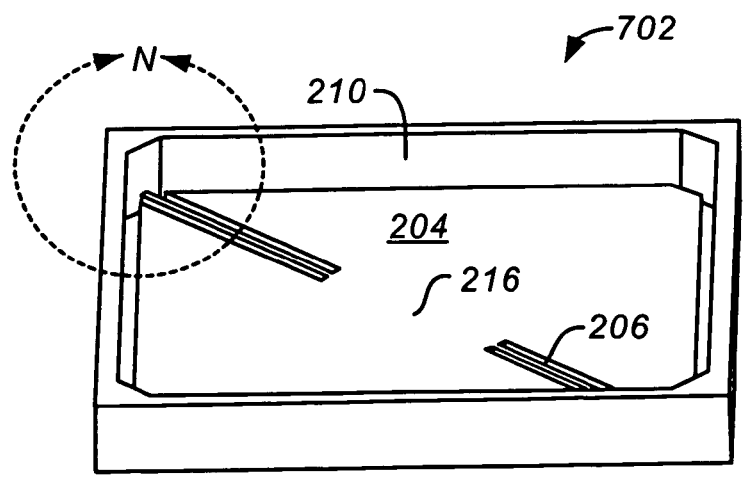

FIG. 7a is a perspective view of a micro mirror 702 according to an alternate embodiment of the invention. The torsion hinge 206 in this embodiment is diagonally oriented with respect to the spacer support wall 210, and divides the mirror plate 204 into two parts, or sides: a first side 704 and a second side 706. Two electrodes 126 are associated with the mirror 702, one electrode 126 for a first side 704 and one electrode 126 for a second side 706. This allows either side 704, 706 to be attracted to one of the electrodes 126 beneath and pivot downward, and provides more total range of angular motion for the same support wall 210 height as compared to the mirror illustrated in FIGS. 2-6. FIG. 7b is a more detailed view of the mirror 702 and illustrates the mirror plate 204, hinge 206, and support wall 210. FIGS. 7c and 7d illustrate the underside of a single mirror 702 and a more detailed view of the interior corner of the mirror 702. In other embodiments, the hinge 206 may be substantially parallel to one of the sides of the mirror plate 204, rather than diagonal, and still be positioned to divide the mirror plate 204 into two parts 704, 706.

Figures 8A, 8B:
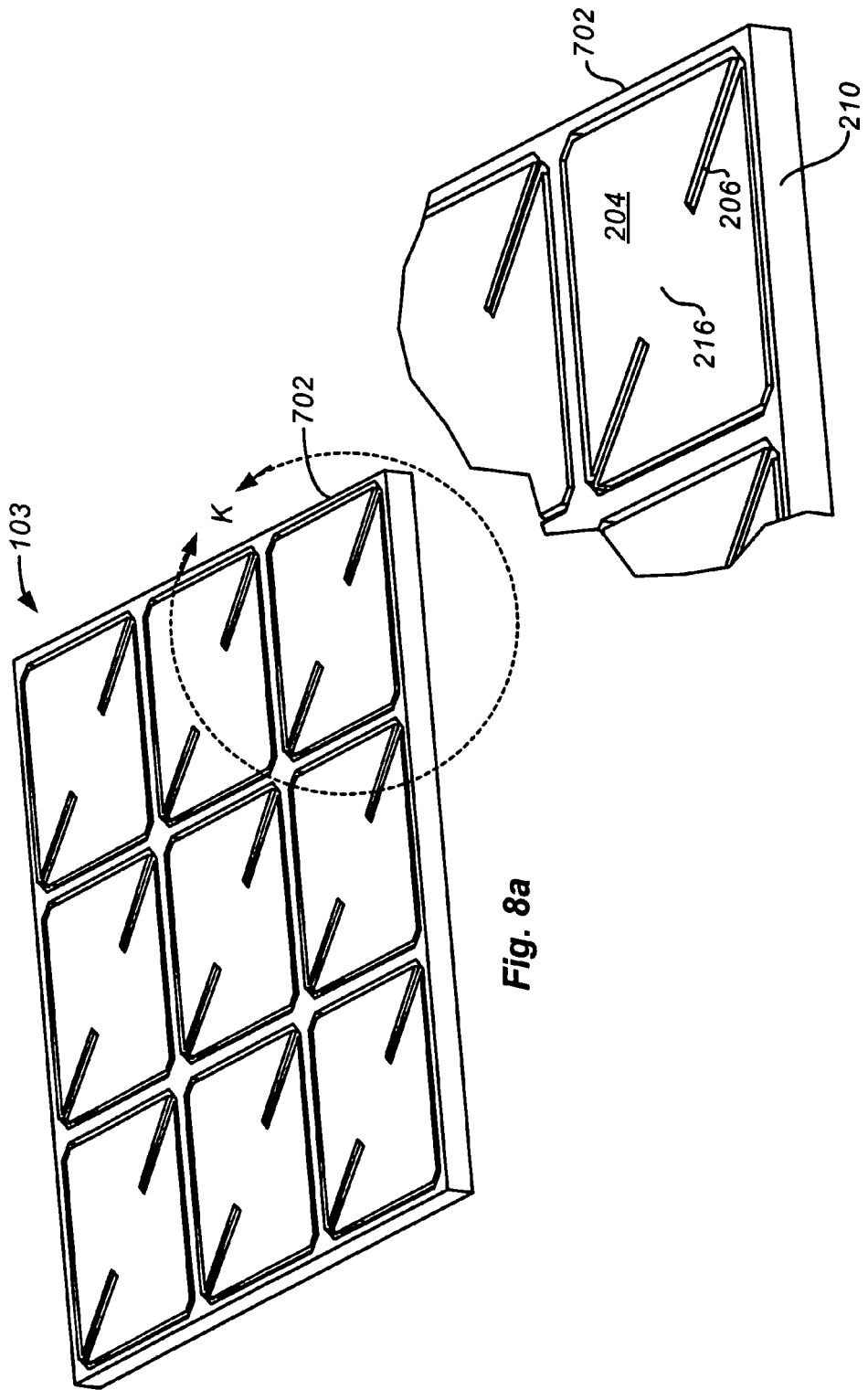

FIGS. 8a through 8d are various perspective views of mirror arrays composed of multiple micro mirrors 702 as described in FIGS. 7a through 7d. FIGS. 8a and 8b illustrate the top of a mirror 702 array and a more detailed view of one mirror 702 in the array. FIGS. 8c and 8d illustrate the underside of a mirror 702 array and a more detailed view of one mirror 702 in the array.

Figure 9A:
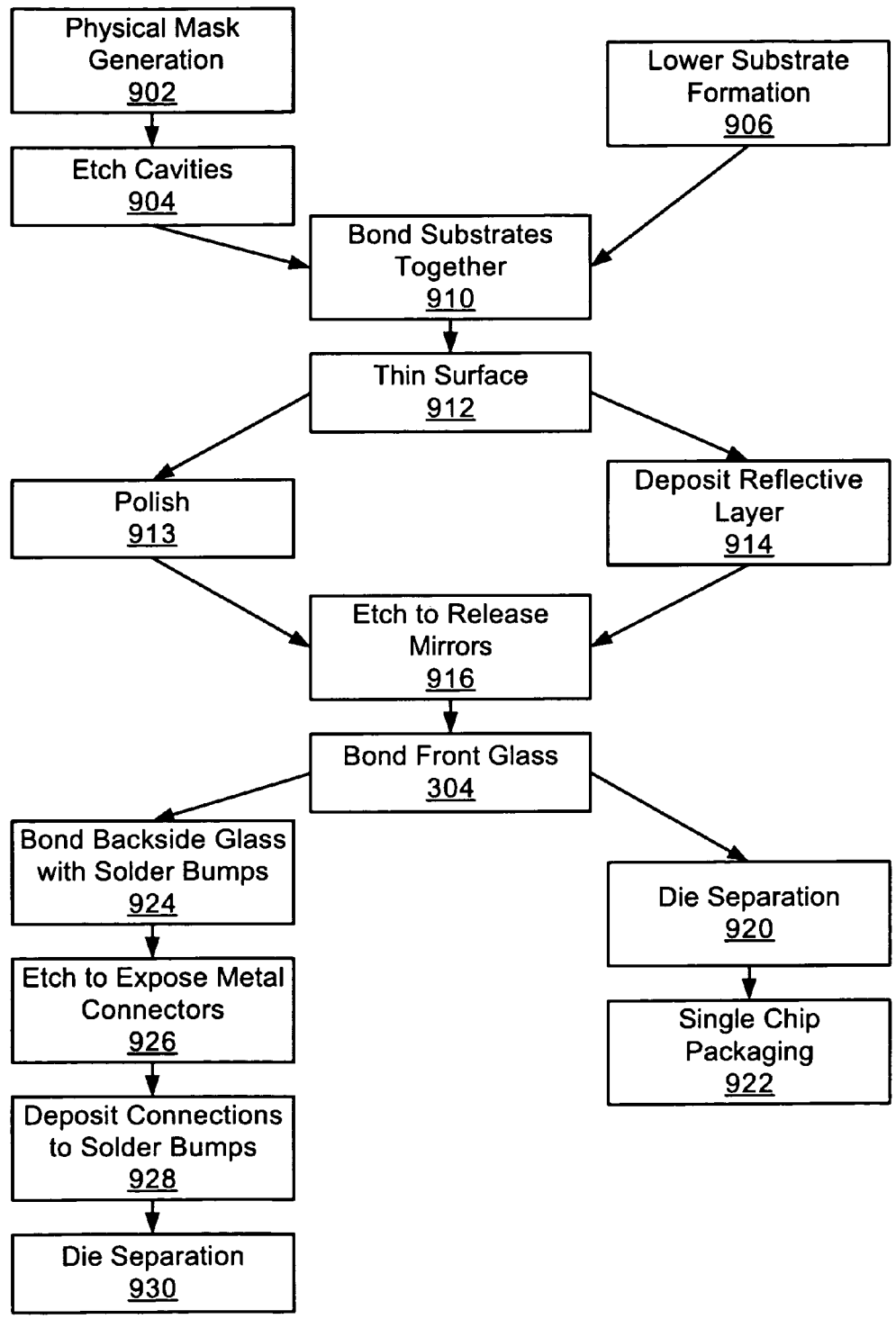
FIG. 9a is a flowchart illustrating a preferred embodiment of how the spatial light modulator is fabricated.

Fabrication of the Spatial Light Modulator:

FIG. 9a is a flowchart illustrating one preferred embodiment of how the spatial light modulator 100 is fabricated. FIGS. 9b through 9g are block diagrams illustrating the fabrication of the spatial light modulator 100 in more detail. In summary, the micro mirrors 202 are partially fabricated on the first substrate 105. Separately, some or all of the electrodes, addressing circuitry, and control circuitry are fabricated on the second substrate 107. The first and second substrates 105 and 107 are then bonded together. The first substrate 105 is thinned, then lithography and etch steps follow. Then the fabrication of the micro mirrors 202 is completed. Final steps, including packaging, complete the spatial light modulator 100. In one embodiment, the mirror may 103 is fabricated from a wafer of single crystal silicon using only anisotropic dry etch methods, only two etches are done to fabricate the mirror may 103, and the circuitry is fabricated using standard CMOS techniques. This provides an easy and inexpensive way to fabricate the SLM 100.

Conventional spatial light modulators are fabricated with surface micro machining techniques that include etching, deposition of structural layers, deposition and removal of sacrificial layers. These conventional MEMS fabrication techniques result in poor yield, poor uniformity, and result feature sizes of approximately 1 micron or larger. In contrast, one embodiment of the present invention uses semiconductor fabrication techniques, which do not include sacrificial layers, have much higher yields, and allow creation of features of 0.13 microns or smaller.

Figure 9B:
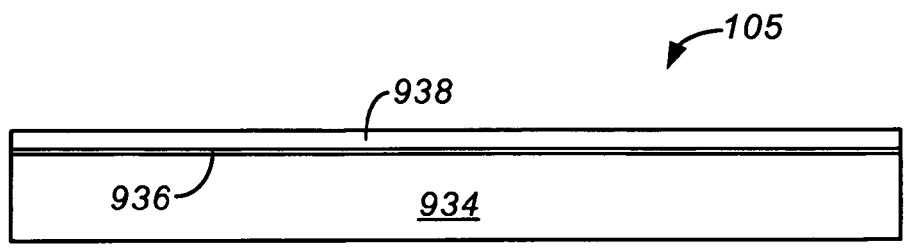
FIGS. 9b through 9j are block diagrams illustrating the fabrication of the spatial light modulator in more detail.
Figure 9C:
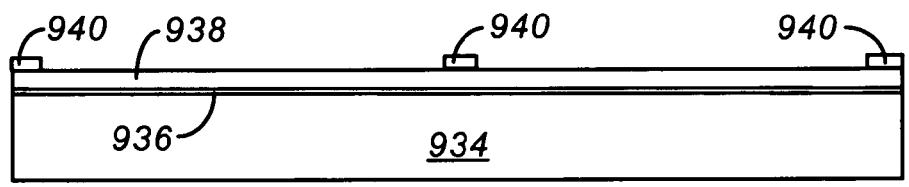

Referring to FIG. 9a, a first mask is generated 902 to initially partially fabricate the micro mirrors 202. This mask defines what will be etched from one side of the first substrate 105 to form the cavities on the underside of the micro mirror array 103 that define the spacer support frames 210 and support posts 208. Standard techniques, such as photolithography, can be used to generate the mask on the first substrate. As mentioned previously, in one preferred embodiment the micro mirrors 202 are formed from a single material, such as single crystal silicon. Thus, in one preferred embodiment, the first substrate 105 is a wafer of single crystal silicon. Note that typically multiple micro mirror arrays 103, to be used in multiple SLMs 100, are fabricated on a single wafer, to be separated later. The structures fabricated to create the micro mirror array 103 are typically larger than the features used in CMOS circuitry, so it is relatively easy to form the micro mirror array 103 structures using known techniques for fabricating CMOS circuitry. FIG. 9b is a side view that illustrates the first substrate 105 prior to fabrication. The substrate 105 initially includes a device layer 938, which is the material from which the mirror array 103 will be fabricated, an insulating oxide layer 936, and a handling substrate 934. FIG. 9c is a side view that illustrates the first substrate 105 with the mask upon it.

Figure 9D:
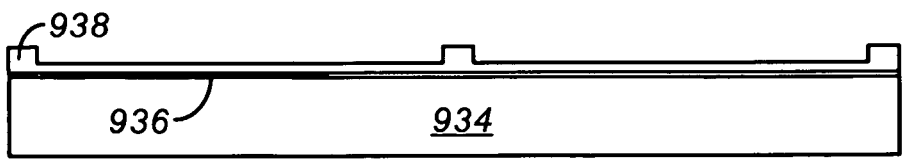

After the mask is generated 902, in a preferred embodiment, the first substrate 105 is anisotropically ion etched 904 to form the cavities beneath the mirror plates 204. Put in another way, a "well" is formed in the first substrate for every micro mirror 202. Other methods besides an anisotropic ion etch may also be used to form the cavities or "wells," such as a wet etch or a plasma etch. FIG. 9d is a block diagram that shows the first substrate 105 with the cavities etched.

Separately from the fabrication of the cavities beneath the mirror plates 204, the electrodes 126 and control circuitry 106 are fabricated 906 on the second substrate 107. The second substrate 107 may be a transparent material, such as quartz, or another material. If the second substrate is quartz, transistors may be made from polysilicon, as compared to crystalline silicon. The circuitry can be fabricated 906 using standard CMOS fabrication technology. For example, in one embodiment, the control circuitry 106 fabricated 906 on the second substrate 107 includes an array of memory cells, row address circuitry, and column data loading circuitry. There are many different methods to make electrical circuitry that performs the addressing function. The DRAM, SRAM, and latch devices commonly known may all perform the addressing function. Since the mirror plate 204 area may be relatively large on semiconductor scales (for example, the mirror plate 204 may have an area of 225 square microns), complex circuitry can be manufactured beneath micro mirror 202. Possible circuitry includes, but is not limited to, storage buffers to store time sequential pixel information, circuitry to compensate for possible non-uniformity of mirror plate 204 to electrode 126 separation distances by driving the electrodes 126 at varying voltage levels, and circuitry to perform pulse width modulation conversions.

This control circuitry 106 is covered with a passivation layer such as silicon oxide or silicon nitride. Next, a metallization layer is deposited. This metallization layer is patterned and etched to define electrodes 126, as well as a bias/reset bus in one embodiment. The electrodes 126 are placed during fabrication so that one or more of the electrodes 126 corresponds to each micro mirror 202. As with the first substrate 105, typically multiple sets of circuitry to be used in multiple SLMs 100 are fabricated 906 on the second substrate 107 to be separated later.

Figure 9E:
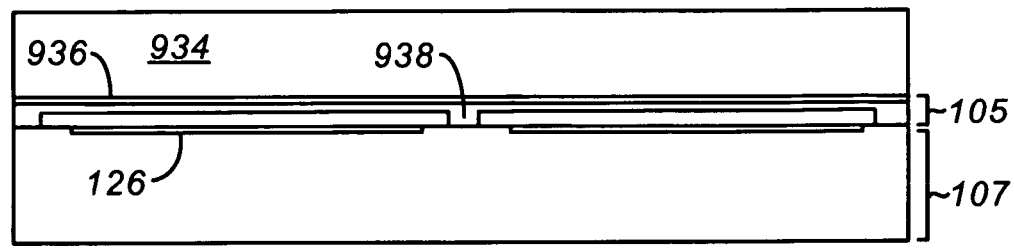

Next, the first and second substrates are bonded 910 together. The side of the first substrate 105 that has the cavities is bonded to the side of the second substrate 107 that has the electrodes. The substrates 105 and 107 are aligned so that the electrodes on the second substrate 107 are in the proper position to control the deflection of the micro mirrors 202 in the micro mirror array 103. In one embodiment, the two substrates 105 and 107 are optically aligned using double focusing microscopes by aligning a pattern on the first substrate 105 with a pattern on the second substrate 107, and the two substrates 105 and 107 are bonded together by low temperature bonding methods such as anodic or eutectic bonding. There are many possible alternate embodiments to the fabrication 906. For example, thermoplastics or dielectric spin glass bonding materials can be used, so that the substrates 105 and 107 are bonded thermal-mechanically. FIG. 9e is a side view that shows the first and second substrates 105, 107 bonded together.

Figure 9F:
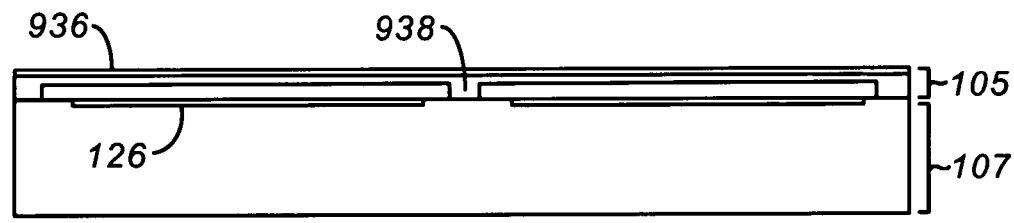
Figure 9G:
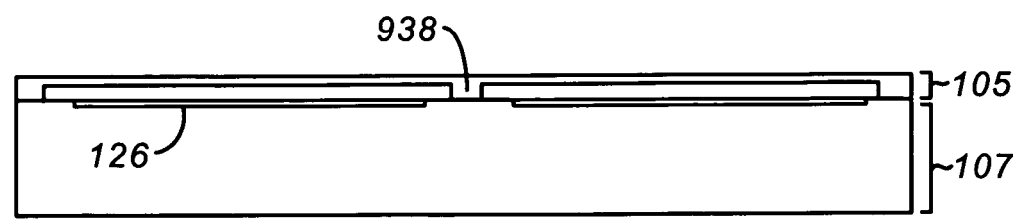

After bonding the first and second substrates 105 and 107 together, the surface of the first substrate 105 that has not been etched is thinned 912 to a desired thickness. First, the handling substrate 934 is removed, as shown in FIG. 9f, typically by grinding or etching. Then the oxide 936 is removed. Then, the device layer 938 is thinned or polished, if necessary. This thinning is done in one embodiment by mechanical grinding the substrate 105 to & thickness between the bottom of the fabricated "well" and the opposing surface of the first substrate 105 that is near the desired thickness of the micro mirror 202. In one embodiment, this thickness achieved by mechanical grinding is approximately 5 microns. The substrate 105 is then polished by mechanical fine polishing or chemical mechanical polishing to thickness desired between the bottom of the "well" and the opposing surface of the first substrate 105. This thickness defines the thickness of the mirror plates 204. In one embodiment, this desired thickness is less than approximately 1 micron or less. FIG. 9g is a side view showing the bonded first and second substrates 105, 107 after the first substrate 105 has been thinned.

Next, the reflective surface of the micro mirror 202 is created. This can be done through polishing 913 the first substrate 105 so that the surface of the first substrate 105 is reflective. It is also possible to deposit 914a layer of a reflective material on the first substrate 105 to create a reflective surface. Other methods to create a reflective surface may also be used.

Figure 9H:
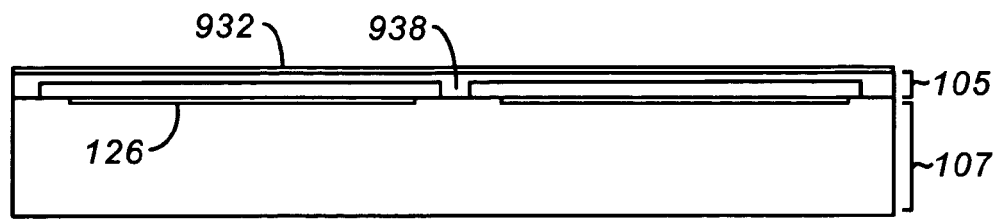

In one embodiment, a reflective layer of aluminum is deposited 914. The thinned surface of the first substrate 105 is coated with approximately 10 nm of titanium seed thin film. Then an approximately 30 nm thick layer of aluminum is deposited to form a reflective layer with a reflectivity above 95% over much of the visible optical spectrum. FIG. 9h is a side view that shows a deposited reflective layer 932.

Figure 9I:
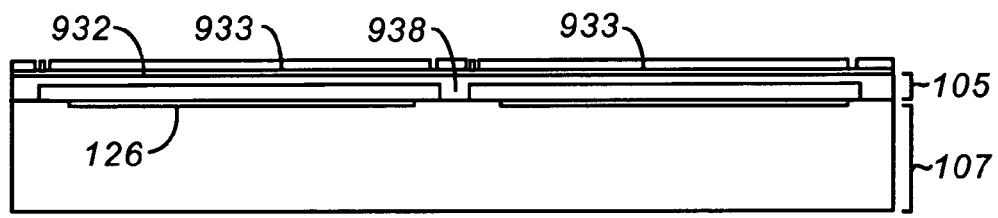
Figure 9J:
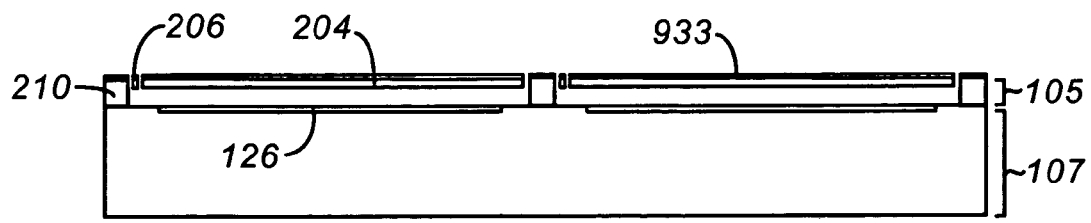

The reflective surface of the first substrate 105 is then masked and, in a preferred embodiment, high-aspect-ratio anisotropically ion etched 916 to finish forming the micro mirror array 103 and release the mirror plates 204. This second etch defines the mirror plate 204, the torsion spring hinge 206, and the connector 216. Thus, it only takes two etchings of the first substrate 105 to fabricate the micro mirrors 202. This significantly decreases the cost of fabricating the micro mirrors 202. FIG. 9i is a block diagram showing the surface of the first substrate 105 covered with the mask 933, and FIG. 9j is a block diagram showing the spatial light modulator 100 after the second etching, including the mirror plate 204, the hinge 206, the spacer support frame 210, and the electrode 126.

Particular embodiments in accordance with the present invention relate to improved methods for releasing the reflecting mirrors from the surrounding material. These embodiments are described below in the section entitled "Mirror Release".

In some embodiments, the hinges 206 are partially etched to be recessed from the surface of the mirror plates 204. Also, in some embodiments a reflective surface is deposited 914 after the second etch that defines the mirror plate 204, the torsion spring hinge 206, and the connector 216. Such a reflective layer may be deposited by, for example, evaporating aluminum downwardly at an angle such that the horizontal vector of the angle is from mirror plate 204 to hinges 206. With this angle, and if the hinges 206 were etched so that they are recessed from the surface of the mirror plates 204, it is possible to deposit substantially no reflective coating on the surfaces of recessed hinges 206 to minimize the optical scattering of incident light by the surfaces of the torsion hinges 206. The evaporation may occur, for example, in the reaction chamber of an e-gun thermal evaporator at a deposition rate of one nanometer per second.

In some embodiments, the micro-mirror array 103 is protected by a capping layer, which may comprise a piece of glass or other transparent material. In one embodiment, during fabrication of the micro mirror array 103, a rim is left around the perimeter of each micro mirror array 103 fabricated on the first substrate 105. To protect the micro mirrors 202 in the micro mirror array 103, a piece of glass or other transparent material is bonded 918 to the rim. This transparent material protects the micro mirrors 202 from physical harm. In one alternative embodiment, lithography is used to produce an array of rims in a layer of photosensitive resin on a glass plate. Then epoxy is applied to the upper edge of the rims, and the glass plate is aligned and attached to the completed reflective SLM 100.

As discussed above, multiple spatial light modulators 100 may be fabricated from the two substrates 105 and 107; multiple micro mirror arrays 103 may be fabricated in the first-substrate 105 and multiple sets of circuitry may be fabricated in the second substrate 107. Fabricating multiple SLMs 100 increases the efficiency of the spatial light modulator 100 fabrication process. However, if multiple SLMs 100 are fabricated at once, they must be separated into the individual SLMs 100. There are many ways to separate each spatial light modulator 100 and ready it for use. In a first method, each spatial light modulator 100 is simply die separated 920 from the rest of the SLMs 100 on the combined substrates 105 and 107. Each separated spatial light modulator 100 is then packaged 922 using standard packaging techniques.

In a second method, a wafer-level-chip-scale packaging is carried out to encapsulate each SLM 100 into separate cavities and form electrical leads before the SLMs 100 are separated. This further protects the reflective deflectable elements and reduces the packaging cost. In one embodiment of this method, the backside of the second substrate 107 is bonded 924 with solder bumps. The backside of the second substrate 107 is then etched 926 to expose metal connectors that were formed during fabrication of the circuitry on the second substrate 107. Next, conductive lines are deposited 928 between the metal connectors and the solder bumps to electrically connect the two. Finally, the multiple SLMs are die separated 930.

Figure 10:
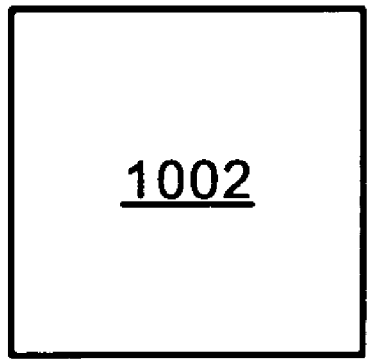
FIG. 10 illustrates the generation of the mask and the etching that forms the cavities in the first substrate in more detail.
Figure 10:
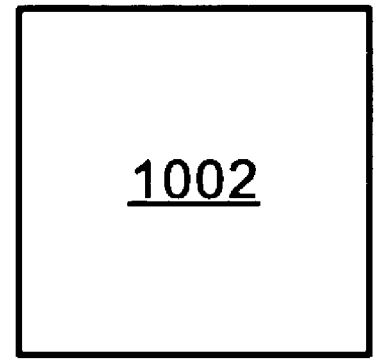
Figure 10:
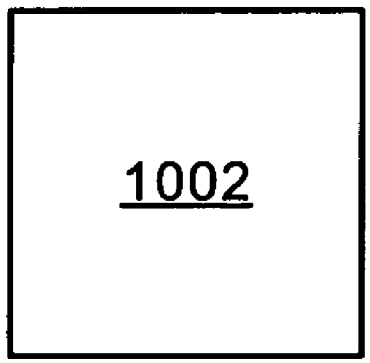
Figure 10:
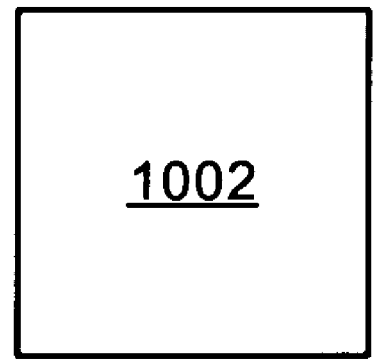

FIG. 10 illustrates the generation 902 of the mask 1000 and the etching 904 that forms the cavities in the first substrate in more detail. In a preferred embodiment, the first substrate is a wafer of single crystal silicon. Oxide is deposited and patterned on the first substrate. This results in the pattern shown in FIG. 10, where area 1004 is oxide that will prevent the substrate beneath from being etched, and areas 1002 are areas of exposed substrate. The areas of exposed substrate 1002 will be etched to form the cavities. The areas 1004 that are not etched remain, and form the spacer support posts 208 and the spacer support frame 210.

In one embodiment, the substrate is etched in a reactive ion etch chamber flowing with $SF_6$, HBr, and oxygen gases at flow rates of 100 sccm, 50 sccm, and 10 sccm respectively. The operating pressure is in the range of 10 to 50 mTorr, the bias power is 60 W, and the source power is 300 W. In another embodiment, the substrate is etched in a reactive ion etch chamber flowing with $Cl_2$, HBr, and oxygen gases at flow rates of 100 sccm, 50 sccm, and 10 sccm respectively. In these embodiments, the etch processes stop when the cavities are about 3-4 microns deep. This depth is measured using in-situ etch depth monitoring, such as in-situ optical interferometer techniques, or by timing the etch rate.

In another embodiment, the cavities are formed in the wafer by an anisotropic reactive ion etch process. The wafer is placed in a reaction chamber. $SF_6$, HBr, and oxygen gases are introduced into the reaction chamber at a total flow rate of 100 sccm, 50 seem, and 20 seem respectively. A bias power setting of 50 W and a source power of 150 W are used at a pressure Of 50 mTorr for approximately 5 minutes. The wafers are then cooled with a backside helium gas flow of 20 sccm at a pressure of 1 mTorr. In one preferred embodiment, the etch processes stop when the cavities are about 3-4 microns deep. This depth is measured using in-situ etch depth monitoring, such as in-situ optical interferometer techniques, or by timing the etch rate.

Figure 11:
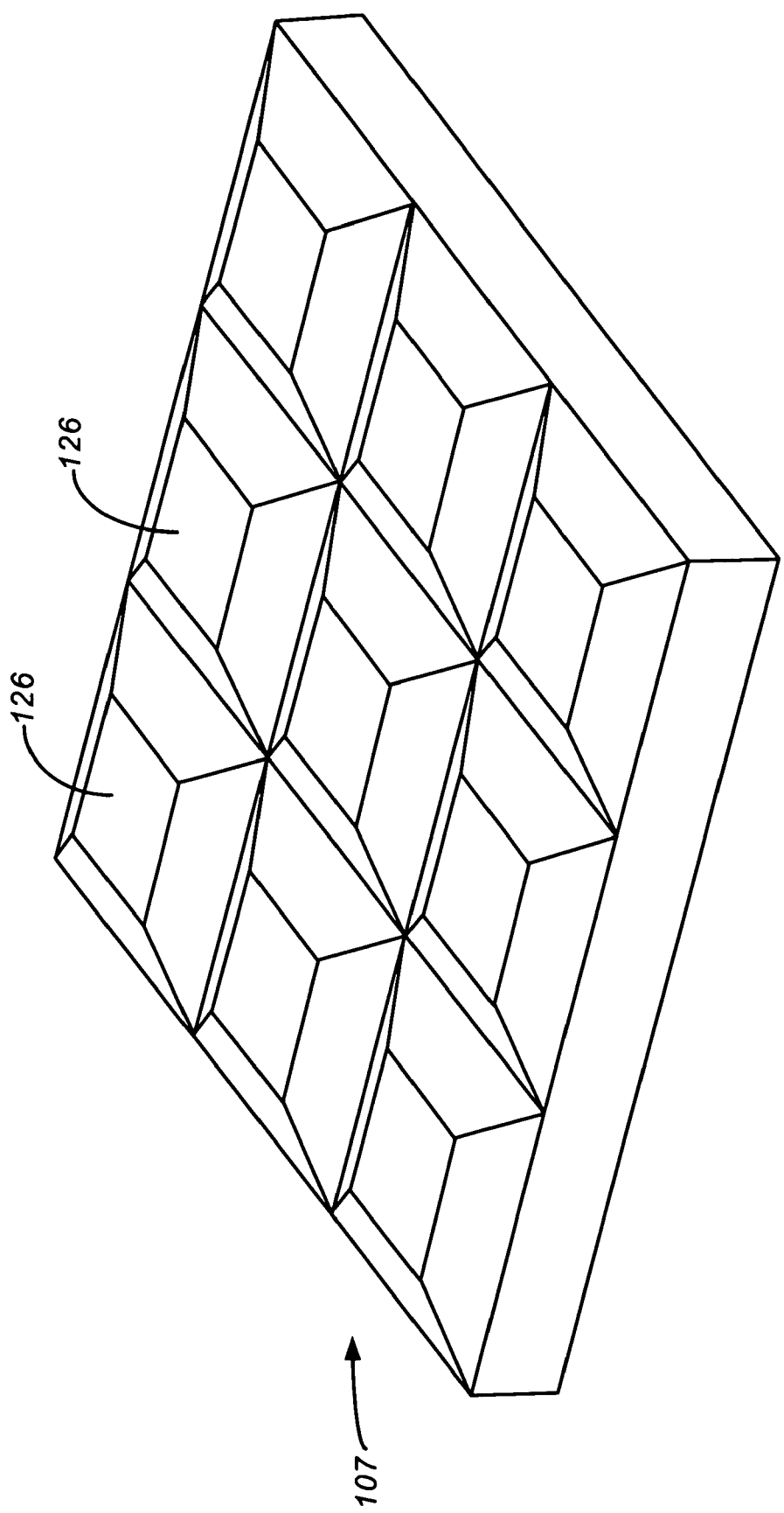
FIG. 11 is a perspective view of one embodiment of the electrodes formed on the second substrate.

FIG. 11 is a perspective view of one embodiment of the electrodes 126 formed on the second substrate 107. In this embodiment, each micro mirror 202 has a corresponding electrode 126. The electrodes 126 in this illustrated embodiment are fabricated to be higher than the rest of the circuitry on the second substrate 107. As shown in FIG. 11, material on the sides of the electrodes 126 slopes down from the electrodes top surface in a somewhat pyramid shape. In other embodiments, the electrodes 126 are located on the same level as the rest of the circuitry on the second substrate 107, rather than extending above the circuitry. In one embodiment of the invention, the electrodes 126 are individual aluminum pads of approximately 10×10 microns in size. These electrodes 126 are fabricated on the surface of the second substrate 107. The large surface area of the electrodes 126 in this embodiment results in relatively low addressing voltages required to pull mirror plate 204 down onto the mechanical stops, to cause the full pre-determined angular deflection of mirror plates 204.

Figure 12:
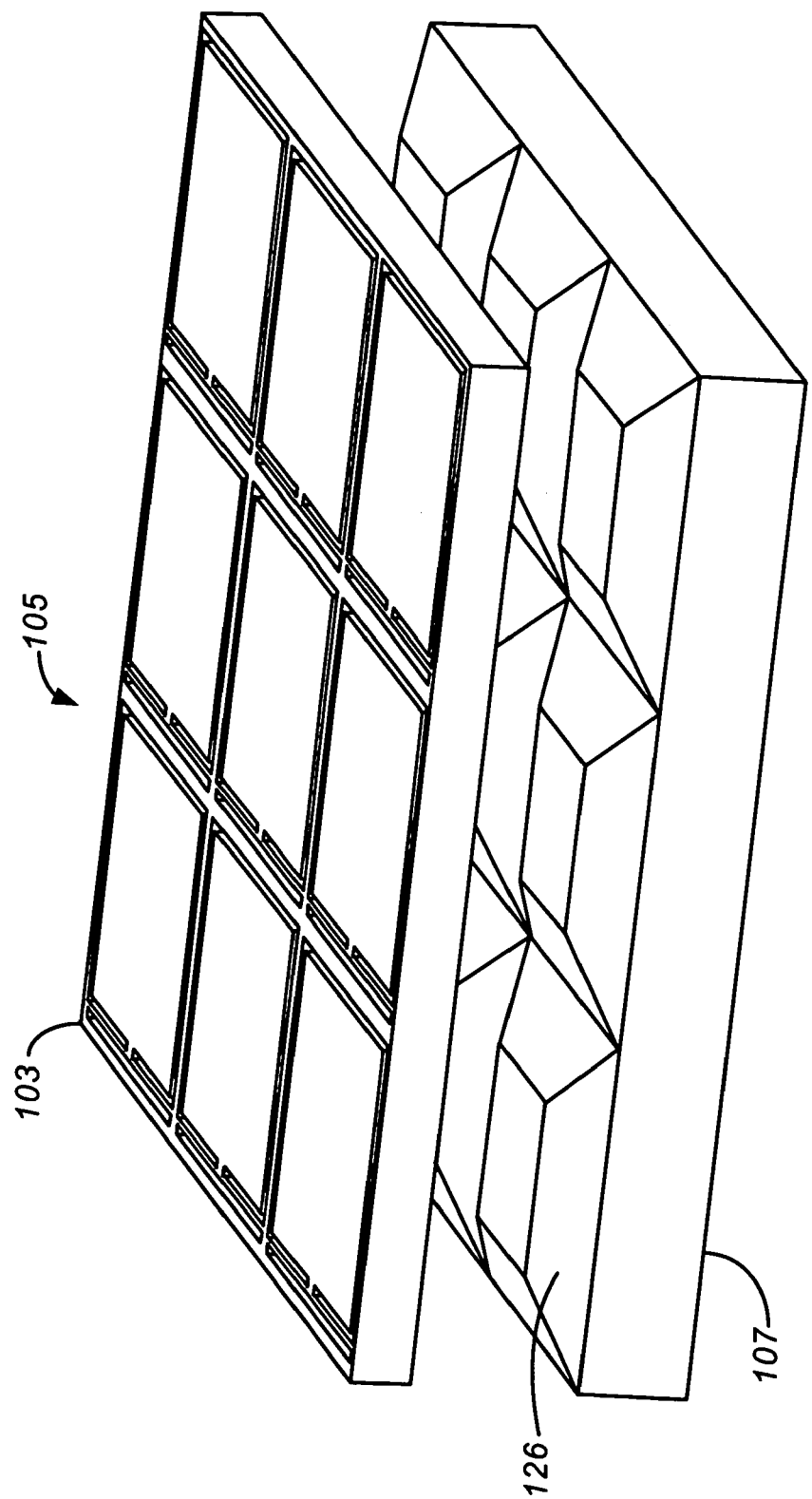
FIG. 12 is a perspective view showing the micro mirror array on the first substrate positioned over the electrodes and other circuitry on the second substrate.

FIG. 12 is a perspective view showing the micro mirror array 103 on the first substrate 105 positioned over the electrodes 126 and other circuitry on the second substrate 107. This illustrates the relative positions of the micro mirrors 202 in the micro mirror array 103 and the electrodes prior to bonding 910 the first and second substrates 105 and 107 together. Note that, for illustrative purposes, the micro mirrors 202 in the micro mirror array 103 are shown as completed micro mirrors 202. However, in a preferred embodiment, as described with respect to FIG. 9a, only the cavities beneath the mirror plates 204 in the first substrate 105 would have been etched prior to bonding the first substrate 105 to the second substrate 107. The mirror plate 204, hinges 206, and connectors 216 would not be fabricated yet. In embodiments where the electrodes 126 are located above the level of the rest of the circuitry and material on the side of the electrodes 126 slopes down, the sloping material helps correctly position the first substrate 105 on the second substrate 107.

Figure 13:
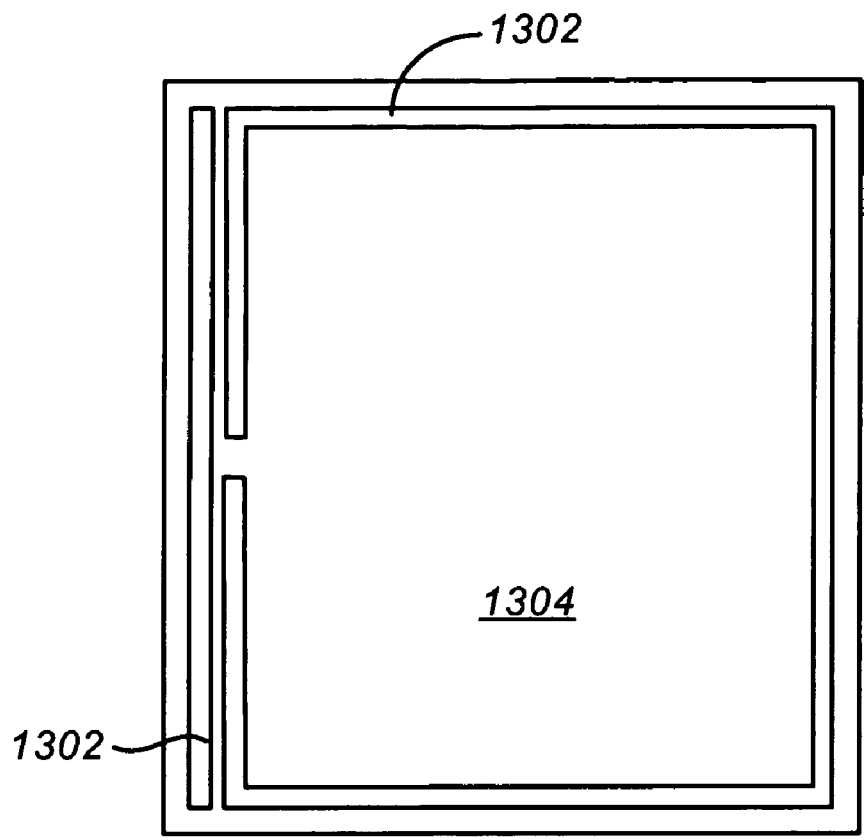
FIG. 13 illustrates a simplified embodiment of a mask that is used in etching the upper surface of the first substrate.

FIG. 13 illustrates, a simplified embodiment of a mask that is used in etching 96 the upper surface of the first substrate 105. In the etching 916 step, areas 1302 are left exposed and are etched to release the mirror plates 204 and form the torsion springs 206, the connectors 216, and the support posts 208. Other areas 1304 are covered with photoresist material and are not etched. These areas include the mirror plates 204 themselves and the material that will form the hinges 206. As shown in FIG. 13, most of the surface of the mirror array 103 is reflective. The fabrication process only creates small non-reflective gaps that separate the mirror plates 204 from the support walls 210 and hinges 206.

The upper surface of the first substrate 105 is etched to release the mirror plates 204 and form the hinges 206 after the upper surface of the first substrate 105 is masked. In one embodiment, it is etched in a reactive ion etch chamber flowing with $SF_6$, HBr, and oxygen gases at a flow rate of 100 sccm, 50 sccm, and 10 sccm respectively. The operating pressure is in the range of 10 to 50 mTorr, and the bias power of 60 W and a source power 300 W. Since the etch depth is typically less than 1 micron, there are several other fabrication processes can achieve the same goal. Another embodiment uses $Cl_2$ and oxygen gases at an operating pressure of 10 mTorr to 50 mTorr with bias and source power settings of the etching reaction chamber of 50 W and 300 W, respectively, to achieve tight dimension control. The etch process is stopped at the desired depth (in one embodiment about 5 microns deep) using in-situ etch depth monitoring or by timing the etch rate.

Operation:

In operation, individual reflective elements are selectively deflected and serve to spatially modulate light that is incident to and reflected by the mirrors.

Figure 14:
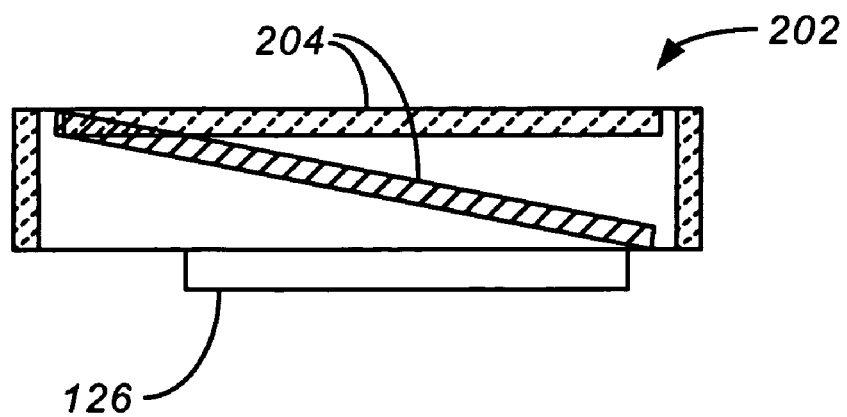
FIG. 14 is across-section of a portion of the two substrates bonded together.

FIG. 14 is a cross-section that shows the micro mirror 202 above an electrode 126. In operation, a voltage is applied to an electrode 126 to control the deflection of the corresponding mirror plate 204 above the electrode 126. As shown in FIG. 14, when a voltage is applied to the electrode 126, the mirror plate 204 is attracted to the electrode. This causes the mirror plate 204 to rotate about the torsion spring 206. When the voltage is removed from the electrode 126, the hinge 206 causes the mirror plate 204 to spring back upward. Thus, lit striking the mirror plate 204 is reflected in a direction that can be controlled by the application of voltage to the electrode.

One embodiment is operated as follows. Initially the mirror plate is undeflected. In this unbiased state, an incoming light beam, from a light source, obliquely incident to SLM 100 is reflected by the flat mirror plates 204. The outgoing, reflected light beam may be received by, for example, an optical dump. The light reflected from the undeflected mirror plate 204 is not reflected to a video display.

When a voltage bias applied between the mirror plate 204 and the bottom electrode 126, the mirror plate 204 is deflected due to electrostatic attraction. Because of the design of the hinge 206, the free end of the mirror plate 204 is deflected towards the second substrate 107. Note that in one preferred embodiment substantially all the bending occurs in the hinge 206 rather than the mirror plate 204. This may be accomplished in one embodiment by making the hinge width 222 thin, and connecting the hinge 206 to the support posts 208 only on both ends. The deflection of the mirror plate 204 is limited by motion stops, as described above. The full deflection of the mirror plate 204 deflects the outgoing reflected light beam into the imaging optics and to the video display.

When the mirror plate 204 deflects past the "snapping" or "pulling" voltage (approximately 12 volts in one embodiment), the restoring mechanical force or torque of the hinge 206 can no longer balance the electrostatic force or torque and the mirror plate 204 "snaps" down toward the electrode 126 to achieve full deflection, limited only by the motion stops. To release the mirror plate 204 from its fully deflected position, the voltage must be lowered—substantially below the snapping voltage to a releasing voltage (e.g., approximately 3.3 volts, in the embodiment where the snapping voltage is 5.0 volts). Thus, the micro mirror 202 is an electromechanically bistable device. Given a specific voltage between the releasing voltage and the snapping voltage, there are two possible deflection angles at which the mirror plate 204 may be, depending on the history of mirror plate 204 deflection. Therefore, the mirror plate 204 deflection acts as a latch. These bistability and latching properties exist since the mechanical force required for deflection of the mirror plate 204 is roughly linear with respect to deflection angle, whereas the opposing electrostatic force is inversely proportional to the distance between the mirror plate 204 and the electrode 126.

Since the electrostatic force between the mirror plate 204 and the electrode 126 depends on the total voltage between the mirror plate 204 and the electrode 126, a negative voltage applied to a mirror plate 204 reduces the positive voltage needed to be applied to the electrode 126 to achieve a given deflection amount. Thus, applying a voltage to a mirror array 103 can reduce the voltage magnitude requirement of the electrodes 126. This can be useful, for example, because in some applications it is desirable to keep the maximum voltage that must be applied to the electrodes 126 below 12V because a 5V switching capability is more common in the semiconductor industry. In addition; the amount of charge needed to bias each electrode 126 where a voltage is applied to a mirror array 103 is smaller than the charge needed in an embodiment in which the mirror array 103 is held at a ground potential. Thus the time required to correctly apply the proper voltage to the electrode 126 and deflect the mirror plate 204 is relatively fast.

Since the maximum deflection of the mirror plate 204 is fixed, the SLM 100 can be operated in a digital manner if it is operated at voltages past the snapping voltage. The operation is essentially digital because the mirror plate 204 is either fully deflected downward by application of a voltage to the associated electrode 126 or is allowed to spring upward, with no voltage applied to the associated electrode 126. A voltage that causes the mirror plate 204 to fully deflect downward until stopped by the physical elements that stop the deflection of the mirror plate 204 is known as a "snapping" or "pulling" voltage. Thus, to deflect the mirror plate 204 fully downward, a voltage equal or greater to the snapping voltage is applied to the corresponding electrode 126. In video display applications, when the mirror plate 204 is fully deflected downward, the incident light on that mirror plate 204 is reflected to a corresponding pixel on a video display. When the mirror plate 204 is allowed to spring upward, the light is reflected in such a direction so that it does not strike the video display.

During such digital operation, it is not necessary to keep the full snapping voltage on an electrode 126 after an associated mirror plate 204 has been fully deflected. During an "addressing stage," voltages for selected electrodes 126 that correspond to the mirror plates 204 which should be fully deflected are set to levels required to deflect the mirror plates 204. After the mirror plates 204 in question have deflected due to the voltages on electrodes 126, the voltage required to hold the mirror plates 204 in the deflected position is less than that required for the actual deflection. This is because the gap between the deflected mirror plate 204 and the addressing electrode 126 is smaller than when the mirror plate 204 is in the process of being deflected. Therefore, in the "hold stage" after the addressing stage the voltage applied to the selected electrodes 126 can be reduced from its original required level without substantially affecting the state of deflection of the mirror plates 204. One advantage of having a lower hold stage voltage is that nearby undeflected mirror plates 204 are subject to a smaller electrostatic attractive force, and they therefore remain closer to a zero-deflected position. This improves the optical contrast ratio between the deflected mirror plates 204 and the undeflected mirror plates 204.

With the appropriate choice of dimensions (in one embodiment, spacer 210 separation between the mirror plate 204 and the electrode 126 of 1 to 5 microns and hinge 206 thickness of 0.05 to 0.45 microns) and materials (such as single crystal silicon (100)), a reflective SLM 100 can be made to have an operating voltage of only a few volts. The torsion modulus of the hinge 206 made—of single crystal silicon may be, for example, 5×10 Newton per meter-squared per radium. The voltage at which the electrode 126 operates to fully deflect the associated mirror plate 204 can be made even lower by maintaining the mirror plate 204 at an appropriate voltage (a "negative bias"), rather than ground. This results in a larger deflection angle for a given voltage applied to an electrode 126. The maximum negative bias voltage is the releasing voltage, so when the addressing voltage reduced to zero the mirror plate 204 can snap back to the undeflected position.

It is also possible to control the mirror plate 204 deflections in a more "analog" manner. Voltages less than the "snapping voltage" are applied to deflect the mirror plate 204 and control the direction in which the incident light is reflected.

Alternate Applications:

Aside from video displays, the spatial light modulator 100 is also useful in other applications. One such application is in maskless photolithography, where the spatial light modulator 100 directs light to develop deposited photoresist. This removes the need for a mask to correctly develop the photoresist in the desired pattern.

Although the invention has been particularly shown and described with reference to multiple embodiments, it will be understood by persons skilled in the relevant art that various changes in form and details can be made therein without departing from the spirit and scope of the invention. For example, the mirror plates 204 may be deflected through methods other than electrostatic attraction as well. The mirror plates 204 may be deflected using magnetic, thermal, or piezo-electric actuation instead.

Mirror Release:

As described above and shown in FIG. 9a, a micro-mirror array fabricated in accordance with embodiments of the present invention, may include reflecting elements formed by releasing a mirror from the surrounding material. The conditions under which this mirror release step is performed may influence the performance of the resulting device.

Conventionally, reflecting elements comprising single crystal silicon have been released from the surrounding material by plasma etching in an ambient comprising oxygen together with chlorinated and/or fluorinated precursors. Oxygen-based plasmas useful for this mirror release processing step offer the advantage of relatively high etch rates of between about 4000-8000 Å/min.

However, use of conventional oxygen-based plasmas for mirror release may result in the unwanted generation of oxide residues. Typically, center portions of a mirror are protected from exposure to oxygen in the plasma, and corresponding formation of residues, by an overlying patterned photoresist mask and reflecting material such as aluminum. However, edge portions of the mirror will be exposed to oxygen during the release step. Single crystal silicon material in these edge portions may readily react with oxygen in the plasma to form silicon oxide. Such silicon oxide residue can accumulate at the edges of the etched mirrors.

The formation of oxide residues during conventional mirror release steps is undesirable for a number of reasons. For example, the presence of the oxide residues can adversely affect the mechanical properties of the micromirror array, interfering with free physical movement of the mirrors after release, and thereby preventing operation.

Silicon oxide residue may also degrade the optical properties of the device. Specifically, light incident to the array will interact with silicon oxide residue in a manner different than light encountering single crystal silicon. For instance, silicon oxide has a different refractive index than silicon or reflective materials such as aluminum. Moreover, silicon oxide residue formed at pixel edges will likely not be planar, but rather will offer an uneven surface or roughness which will promote scattering of light. Such light scattering can result in a decline in the signal-to-background ratio exhibited by the device, producing an unwanted reduction in contrast of the image produced.

During fabrication of other types of semiconductor devices utilizing oxygen plasma, silicon oxide residues resulting from reaction between single crystal silicon and an oxygen plasma may be removed by hydrogen fluoride (HF) wet etching. However, such wet HF etching is not allowed or desirable to fabricate the optical devices described herein, owing to their relative fragility. Specifically, the presence of water or gases trapped by water, between the released micro-mirror and the surrounding material, may result in a capillary force strong enough to impede the intended free movement of the mirror. Moreover, the presence of water from a wet HF etching step between the released mirror and an underlying mirror stop, could also create a stiction force strong enough to impede free movement of the mirror.

Accordingly, a spatial light modulator structure in accordance with an embodiment of the present invention is fabricated by forming moveable reflecting elements through plasma etching of silicon in a chlorine ambient. In one embodiment, a mirror comprising single crystal silicon is released from the surrounding material by plasma etching in an ambient including chlorine ($Cl_2$), sulfur hexafluoride ($SF_6$), and boron trichloride ($BCl_3$). $Cl_2$ serves as a source of reactive chlorine etching species for the plasma. $SF_6$ provides a source of fluorine, a reactive species enhancing the rate of etching single crystal silicon. $BCl_3$ provides boron, which becomes incorporated on the surface of the etched single crystal silicon as a passivation layer controlling etch profile.

Plasma etching of the single crystal silicon to release the mirrors in accordance with embodiments of the present invention, takes place in an ambient substantially lacking oxygen, in order to avoid unwanted formation of silicon oxide residue that can adversely affect mechanical and optical properties of the resulting device. As utilized in this patent application, the term "substantially lacking oxygen" means that oxygen comprises less than 1%, and preferably less than 0.5%, of the gas flowed into the chamber during the mirror release step.

FIG. 16A shows a simplified plan view of a pixel in an embodiment of a micro-mirror array in accordance with the present invention. FIG. 16B shows a simplified cross-sectional view of the pixel of FIG. 16A.

Reflecting surface 1602 of pixel 1600 comprises the top layer of film stack 1604 that is anchored to surrounding material 1606 by hinge portion 1608. The periphery of pixel 1600 is separated from the surrounding material by opening 1610. Hinge portion 1608 is separated from the adjacent regions of the stack 1604 by gaps 1612. In accordance with certain embodiments of the present invention, hinge portion 1608 may exhibit a width in the range of about 0.15 to 0.40 μm, and preferably about 0.18 μm, and be separated from adjacent pixel material by gaps having a width in the range of about 0.2 to 0.4 μm, and preferably about 0.2 μm.

As shown in FIG. 16B, the top reflecting surface 1602 of stack 1604 comprises Aluminum, which is adhered to an underlying single crystal support layer 1614 by an intervening layer 1616 such as titanium. In accordance with one embodiment, the silicon support layer 1614 may exhibit a thickness in the range of about 0.25 to 0.5 μm, and preferably about 0.3 μm, the adhesion layer may comprise Ti having a thickness of between about 100-300 Å, and the reflecting surface 1602 may comprise aluminum having a thickness of between about 300-1000 Å.

Fabrication of the reflecting micro-mirror pixel of FIGS. 16A-B is now described in connection with the cross-sectional views of FIGS. 17A-D, which are simplified in that the thickness of the layers is not shown to scale. FIG. 17A shows the first step in the fabrication process, wherein a continuous film stack 1604 comprising Al reflecting surface 1602, Ti adhesion layer 1616, and underlying silicon support layer 1614, is formed.

FIG. 17B shows the next step, wherein a bottom anti-reflective coating (BARC) 1620 is formed over Al reflecting surface 1602, and then photoresist layer is formed and developed in a pattern 1622. Patterned photoresist 1622 in inter-pixel regions exposes opening 1610 between the individual pixel 1600 and the surrounding material. Patterned photoresist 1622 in intra-pixel regions exposes gaps 1612 between the pixel and the hinge portion that is to be formed.

FIG. 17C shows the next step in the fabrication process, wherein stack 1604 bearing BARC 1620 and patterned photoresist 1622 is exposed to a first set of plasma conditions to open the BARC 1620 and etch the Al 1602 reflecting surface and adhesion layer 1616. The following TABLE sets forth parameters of the first set of plasma conditions.

TABLE

|  | Pressure (mTorr) | RF Power (W) | | Flow Rate (sccm) | | | |
|---|---|---|---|---|---|---|---|
|  |  | Source | Bias | $Cl_2$ | $BCl_3$ | $SF_6$ | $N_2$ |
| BARC | 5-25 | 300-700 | 100-300 | 5-20 | 20-50 | 20-70 | 5-20 |
| Al/Ti | 5-25 | 300-700 | 100-300 | 40-80 | 20-50 | — | 5-20 |

Then, as shown in FIG. 17D, the partially-etched stack 1604 bearing BARC 1620 and patterned photoresist 1622 is exposed to a second set of plasma conditions in the absence of oxygen in accordance with an embodiment of the present invention. As a result of this etching, single crystal silicon underlying openings 1610 and gaps 1612 is removed with a substantially anisotropic profile. This etching defines an individual pixel 1600 rotatably secured to surrounding material by hinge portion 1608.

Following the fabrication step shown in FIG. 17D, the patterned photoresist mask and BARC may be removed by stripping to reveal the structure shown in FIGS. 16A-B. In accordance with one embodiment of the present invention, this stripping can take place in an oxygen plasma formed by application of an RF power of about 1100 W, an $O_2$ flow rate of 3750 sccm, and a temperature of 275° C.

In accordance with one embodiment of the present invention, a micro-mirror formed from single crystal silicon, was released from surrounding material single crystal material through exposure to a plasma etching in chlorine ambient utilizing a DPS Si etch tool available from Applied Materials Corp. of Santa Clara, Calif. The pressure in the chamber was maintained at a pressure of between about 5-50 mTorr. A source plasma power of between about 300-800 W was applied to the chamber. A bias power of between about 100-300 W was applied to the chamber. Of course, methods in accordance with alternative embodiments of the present invention may also be practiced on other types of semiconductor processing tools, for example the Lam 9600 conductor etch tool available from Lam Research Corp. of Fremont, Calif., if similar chemistries and recipes are used.

A flow $Cl_2$ gas into the chamber was maintained at a rate of between about 10-60 sccm. This chlorine gas flow serves to provide the reactive chlorine species that are used to etch the single crystal silicon.

A fluorine-containing component was also flowed into the chamber during the plasma etching of the mirror release step. Specifically, $SF_6$ gas was flowed into the chamber at a rate of between about 10-65 sccm. The role of the fluorine-containing component is to provide some amount of fluorine in the plasma. Such fluorine species are even more reactive than chlorine, and the presence of fluorine can enhance the rate of etching of the single crystal silicon. The relative flow rate of the fluorine-containing component can be controlled to tune the aggressiveness of the plasma etch during the mirror release step.

A boron-containing component was also flowed into the chamber during the plasma etching of the mirror release step. Specifically, $BCl_3$ gas was flowed into the chamber at a rate of between about 10-50 sccm. The role of the boron-containing component is to provide some amount of boron in the plasma. The boron can become incorporated at the surface of the etched single crystal silicon, forming a BClSi passivation layer controlling the profile of the etched species, limiting unwanted effects such lateral etching. Again, the relative flow rate of the boron-containing component can be controlled to tune the profile resulting from the plasma etch during the mirror release step.

The above process conditions relate to only one particular embodiment of a mirror release plasma etching step in accordance with the present invention, and other embodiments are possible. For example, chlorine may be provided to the chamber by other than a flow of chlorine gas, or by a flow of chlorine gas in combination with other chlorine-containing materials. Examples of other chlorine-containing components which may be used in plasma etching include, but are not limited to, $Cl_2$, $CCl_4$, and $BCl_3$. In such embodiments, it is important to obtain anisotropic etch profiles, through sidewall polymerization schemes. This is commonly done by adjusting the relative concentration of $Cl_2$ and an inhibitor forming gas such as $BCl_3$, $CCl_4$, or $SiCl_4$. It can also be done by combining fluorinated precursors with $Cl_2$, for example $C_2F_6$.

Moreover, embodiments in accordance with the present invention are not limited to plasma etching in an ambient including $SF_6$. Fluorine may be provided to the chamber by flowing other fluorine-containing precursors, including but not limited to $CF_4$, $NF_3$, $C_2F_6$, and $CHF_3$. It should also be kept in mind that embodiments in accordance with the present invention do not necessarily require the presence of fluorine during the plasma etching mirror release step. Embodiments in accordance with the present invention do not necessarily require the presence of boron during the plasma etching mirror release step.

Figure 15:
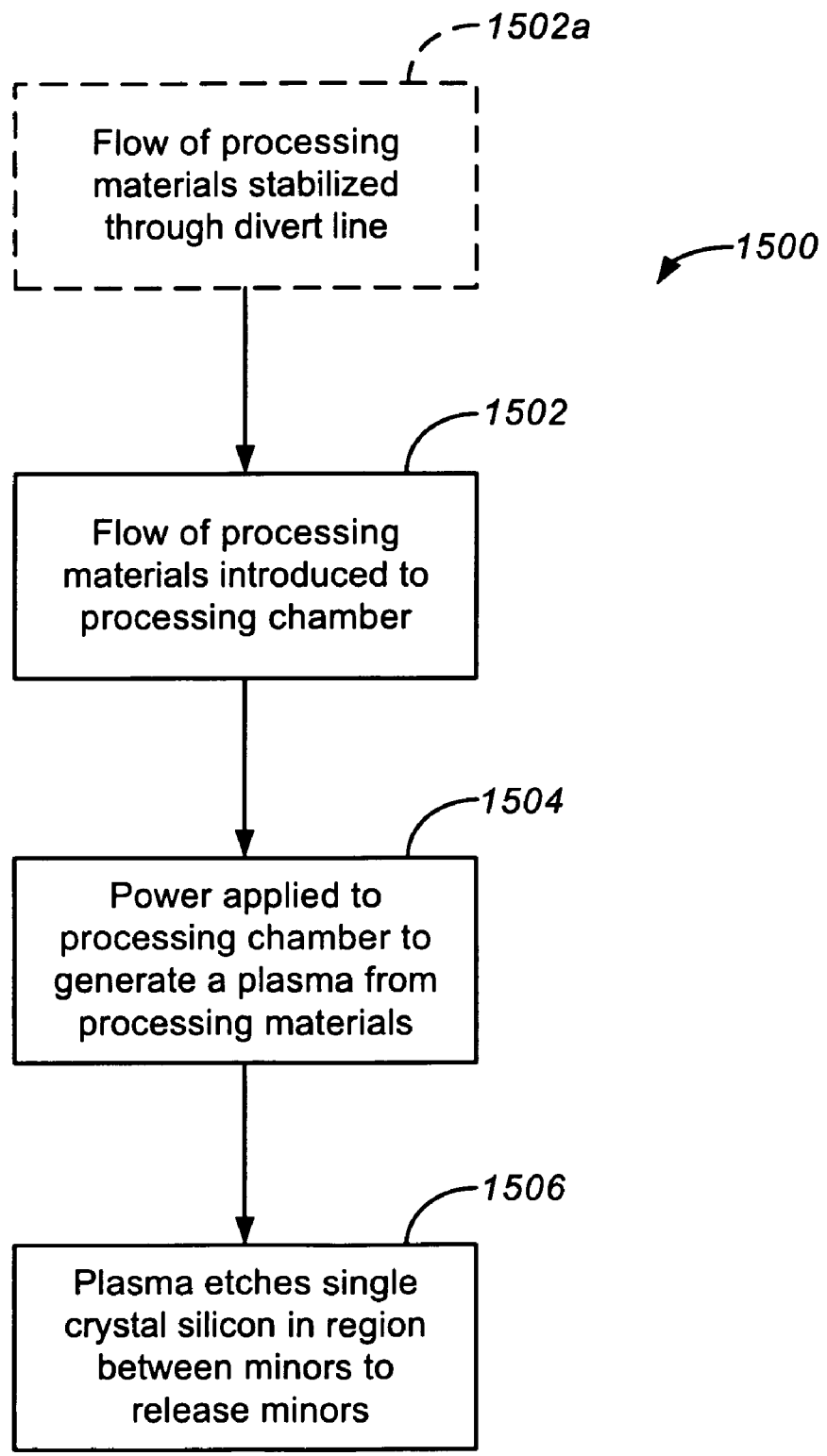
FIG. 15 is a simplified flow diagram of a process in accordance with an embodiment of the present invention for releasing micromirrors.

FIG. 15 is a simplified flow chart showing steps of a method in accordance with an embodiment of the present invention. In first step 1502 of process flow 1500, a flow of processing materials is introduced to a processing chamber having a substrate positioned therein, the substrate including a single crystal layer that is to be defined into a plurality of micro-mirrors. These processing materials include a chlorine-containing gas, and may also include a fluorine-containing material and/or a boron-containing material. In certain embodiments, as shown in step 1502a, a flow rate of one or more of these processing materials may be stabilized through a divert line prior to their introduction into the chamber.

In second step 1504 of process flow 1500, power is applied to the processing chamber to generate a plasma from the processing materials flowed therein. This applied power generates highly reactive species such as chlorine radicals from the ambient present within the chamber. A bias power is also applied to the substrate, in order to direct reactive species in the plasma downward to the substrate, in order to effect etching thereon.

In third step 1506 of process flow 1500, species in the plasma generated within the processing chamber react with and consume unmasked single crystal silicon in inter-mirror regions. This removal of single crystal silicon material releases the mirrors from the surrounding material, freeing them for movement.

Utilization of chlorine-based plasma conditions for mirror etching and release in accordance with embodiments of the present invention, avoids a number of issues associated with the conventional use of oxygen based plasmas for this purpose. For example, the absence of oxygen during this chlorine-based plasma etching avoids the formation of silicon oxide residues which can undesirably impede the free movement of the released mirror, and give rise to background light scattering that can degrade performance of the device.

Moreover, utilization of chlorine-based plasmas for mirror release in accordance with embodiments of the present invention, further lowers the applied power levels as compared with oxygen plasmas. These lower applied power levels, in turn reduce charging of the mirror structures that have been released, preventing them from becoming irreversibly fixed in place by electrostatic attraction to the underlying material.

While the above is a complete description of specific embodiments of the invention, the above description should not be taken as limiting the scope of the invention as defined by the claims.

What is claimed is:

1. A method for fabricating a spatial light modulator, the method comprising:
   providing in a processing chamber, a substrate comprising single crystal silicon having a mask patterned thereon to define inter-mirror regions and hinge regions;
   flowing a chlorine-containing gas into the processing chamber in an absence of oxygen;
   flowing a boron-containing material into the processing chamber with the chlorine-containing gas, wherein boron from the boron-containing material is incorporated in a passivation layer;
   applying power to the processing chamber to generate a plasma from the chlorine-containing gas; and
   exposing the inter-mirror regions to the plasma to remove the single crystal silicon in the inter-mirror regions, thereby releasing a micro-mirror from the surrounding single crystal silicon.

2. The method of claim 1 wherein the chlorine-containing gas is selected from the group comprising $Cl_2$, $CCl_4$, and $BCl_3$.

3. The method of claim 1 further comprising flowing an inhibitor gas with the chlorine-containing gas, the inhibitor gas selected from the group comprising $BCl_3$, $CCl_4$, and $SiCl_4$.

4. The method of claim 1 wherein the boron-containing material comprises boron trichloride.

5. The method of claim 1 further comprising stabilizing a flow of at least one of the chlorine-containing gas, a fluorine-containing gas, and a boron-containing material through a divert line prior to introduction to the processing chamber.

6. The method of claim 1 wherein the single crystal silicon substrate has a thickness of between about 2000-6000 Å.

7. The method of claim 1 wherein the single crystal silicon substrate is removed by the plasma at a rate of about 6000 Å/min.

8. The method of claim 1 wherein a reflecting surface overlies the single crystal silicon substrate, the method further comprising etching the reflecting surface under conditions different from those used to etch the single crystal silicon.

9. The method of claim 1 wherein single crystal silicon in intra-mirror regions is also exposed to the plasma to define gaps adjoining a moveable hinge portion.

10. The method of claim 9 wherein the single crystal silicon is exposed to the plasma through openings in patterned photoresist.

11. The method of claim 1 further comprising flowing a fluorine-containing gas into the processing chamber with the chlorine-containing gas.

12. The method of claim 11 further comprising adjusting a single crystal silicon etch rate by adjusting a flow rate of the fluorine-containing gas.

13. The method of claim 12 wherein the fluorine-containing gas is selected from the group comprising $SF_6$, $CF_4$, $NF_3$, $C_2F_6$, and $CHF_3$.

14. A method for defining a moveable reflecting element of a spatial light modulator, the method comprising:
   providing a substrate comprising single crystal silicon;

patterning a mask on the substrate to define inter-mirror regions; and etching through the substrate in inter-mirror regions with a plasma generated in an ambient substantially lacking oxygen and including a boron-containing material, wherein boron from the boron-containing material is incorporated in a passivation layer.

15. The method of claim 14 further comprising introducing fluorine into the ambient to control an etch rate of the single crystal silicon.

16. The method of claim 14 wherein a reflecting surface overlies the single crystal silicon substrate, and the method further comprises etching the reflecting surface under conditions different from those used to etch the single crystal silicon.

17. The method of claim 14 wherein intra-mirror regions are also exposed to the plasma to define gaps adjoining a moveable hinge portion.

* * * * *

UNITED STATES PATENT AND TRADEMARK OFFICE
CERTIFICATE OF CORRECTION

PATENT NO. : 7,666,319 B1  
APPLICATION NO. : 11/264898  
DATED : February 23, 2010  
INVENTOR(S) : Kegang Huang Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 994 days.

Signed and Sealed this

Seventh Day of December, 2010

David J. Kappos
*Director of the United States Patent and Trademark Office*